US 8,841,722 B2

(12) United States Patent
Sammi

(10) Patent No.: US 8,841,722 B2
(45) Date of Patent: Sep. 23, 2014

(54) SEMICONDUCTOR DEVICE AND METHOD OF FORMING THE SAME

(75) Inventor: Masayoshi Sammi, Tokyo (JP)

(73) Assignee: PS4 Luxco S.A.R.L., Luxembourg (LU)

(*) Notice: Subject to any disclaimer, the term of this patent is extended or adjusted under 35 U.S.C. 154(b) by 0 days.

(21) Appl. No.: 13/465,548

(22) Filed: May 7, 2012

(65) Prior Publication Data
US 2012/0286358 A1 Nov. 15, 2012

(30) Foreign Application Priority Data

May 10, 2011 (JP) .................... 2011-105186

(51) Int. Cl.
*H01L 29/66* (2006.01)
*H01L 27/108* (2006.01)
*H01L 49/02* (2006.01)
*H01L 21/8234* (2006.01)

(52) U.S. Cl.
CPC .. *H01L 21/823487* (2013.01); *H01L 27/10817* (2013.01); *H01L 28/91* (2013.01); *H01L 27/10876* (2013.01)
USPC .... 257/334; 257/330; 257/332; 257/E27.091; 257/E29.201; 257/E29.257; 257/E29.26; 438/270; 438/272

(58) Field of Classification Search
CPC ............ H01L 29/7813; H01L 29/4236; H01L 29/66734
USPC .......................................... 257/334, E27.091
See application file for complete search history.

(56) References Cited

U.S. PATENT DOCUMENTS

| | | | | |
|---|---|---|---|---|
| 5,811,336 | A | * | 9/1998 | Kasai ............................ 438/271 |
| 7,564,084 | B2 | * | 7/2009 | Song et al. .................... 257/296 |
| 2007/0228427 | A1 | * | 10/2007 | Matsui et al. ................. 257/288 |
| 2008/0179648 | A1 | * | 7/2008 | Ha et al. ........................ 257/296 |
| 2009/0079005 | A1 | * | 3/2009 | Haffner et al. ................ 257/368 |
| 2011/0104862 | A1 | * | 5/2011 | Kadoya .......................... 438/270 |

FOREIGN PATENT DOCUMENTS

| | | |
|---|---|---|
| JP | 2006-339476 | 12/2006 |
| JP | 2007-081095 | 3/2007 |

* cited by examiner

*Primary Examiner* — Matthew W Such
*Assistant Examiner* — Samuel Lair
(74) *Attorney, Agent, or Firm* — Young & Thompson

(57) ABSTRACT

A semiconductor device includes a semiconductor substrate having a first groove. The first groove has a bottom and first and second side surfaces opposite to each other. A first gate insulator extends alongside the first side surface. A first gate electrode is formed in the first groove and on the first gate insulator. A second gate insulator extends alongside the second side surface. A second gate electrode is formed in the first groove and on the second gate insulator. The second gate electrode is separate from the first gate electrode.

1 Claim, 29 Drawing Sheets

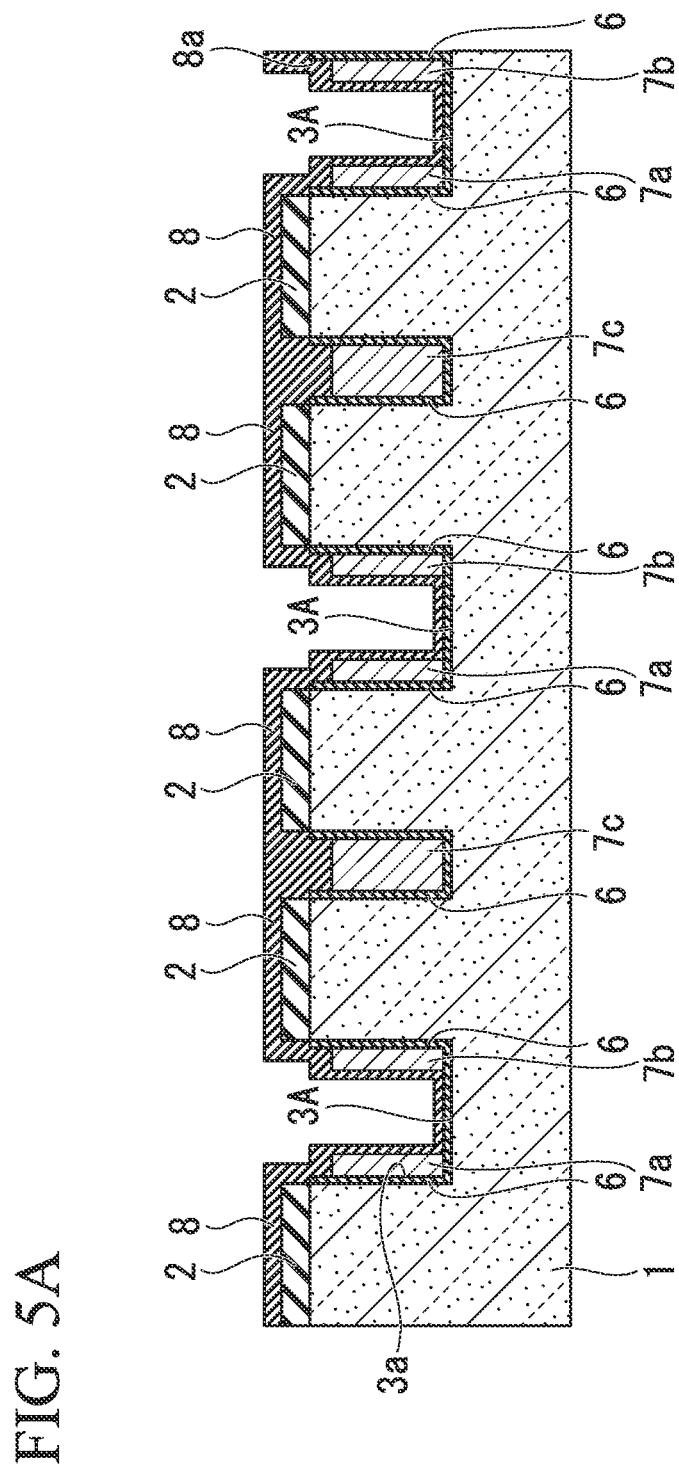

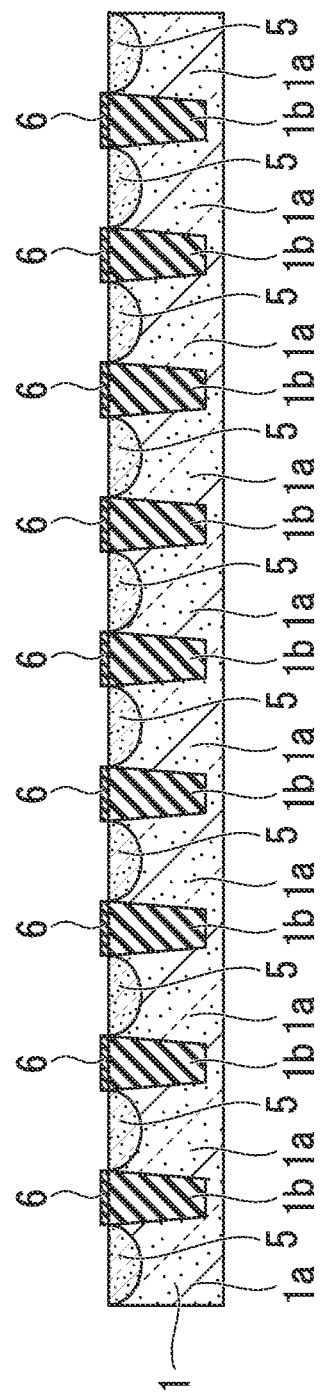

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2011-105186, filed May 10, 2011, the content of which is incorporated herein by reference.

2. Description of the Related Art

In recent years, the nanoscaling of semiconductor devices has been progressing. If the gate length of a transistor is made short, there is cased short-channel effect in the transistor, with the sub-threshold current increasing, and the transistor threshold voltage (Vt) decreasing.

In the case where the impurity concentration in the semiconductor substrate is increased to suppress the decrease of the transistor threshold voltage (Vt), the junction leakage current increases.

For this reason, in the case of nanoscaling of memory cells in a DRAM (dynamic random-access memory) used as the semiconductor device, deterioration of the refresh characteristics will be caused.

Japanese Patent Application Publication No. JPA 2006-339476 and Japanese Patent Application Publication No. JPA 2007-081095 disclose a so-called trench gate transistor (recessed-channel transistor), in which a gate electrode is buried in a trench formed in the front surface side of the semiconductor substrate and, making the transistors have the above-noted constitution, it is possible to physically and sufficiently achieve an effective channel length (gate length), thereby enabling a DRAM having nanoscaled cells with a minimum process dimension of 60 nm or smaller.

In Japanese Patent Application Publication No. JPA 2007-081095, there is disclosure of a DRAM having first and second gate trenches formed to be adjacent to one another in a p-type silicon substrate (semiconductor substrate) with a prescribed spacing therebetween, a gate insulating film formed on the inner wall surface of the first and second gate trenches, a first gate electrode that buries the first gate trench with a gate insulating film intervening therebetween and that also protrudes from the main surface of the p-type silicon substrate, a second gate electrode that buries the second gate trench with a gate insulating film intervening therebetween and that also protrudes from the main surface of the p-type silicon substrate, an impurity diffusion region formed in the p-type silicon substrate at a position between the first gate electrode and the second gate electrode and that will serve as a source/drain region common to the first and second gate electrodes, and an interlayer insulating film that is formed on the surface of the p-type silicon substrate and that also covers the part of the first and second gate electrodes that protrudes from the surface of the p-type silicon substrate.

SUMMARY

In one embodiment, a semiconductor device may include, but is not limited to, a semiconductor substrate, and first and second transistors in the semiconductor substrate. The semiconductor substrate may have, but not limited to, a first groove. The first groove has a bottom and first and second side surfaces opposite to each other. The first transistor may include, but is not limited to, a first gate insulator extending alongside the first side surface; a first gate electrode in the first groove and on the first gate insulator; a first diffusion region underneath the bottom of the first groove; and a second diffusion region in the semiconductor substrate and near the top of the first side surface. The second transistor may include, but is not limited to, a second gate insulator extending alongside the second side surface; a second gate electrode in the first groove and on the second gate insulator, the second gate electrode being separate from the first gate electrode; the first diffusion region; and a third diffusion region in the semiconductor substrate and near the top of the second side surface.

In another embodiment, a semiconductor device may include, but is not limited to, a semiconductor substrate having a first groove, the first groove having a bottom and first and second side surfaces opposite to each other; a first gate insulator extending alongside the first side surface; a first gate electrode in the first groove and on the first gate insulator; a second gate insulator extending alongside the second side surface; and a second gate electrode in the first groove and on the second gate insulator, the second gate electrode being separate from the first gate electrode.

In still another embodiment, a semiconductor device may include, but is not limited to, a semiconductor substrate having first, second and third grooves, the first groove having a bottom and first and second side surfaces opposite to each other, the first groove being positioned between the second and third grooves; a first gate insulator extending alongside the first side surface; a first gate electrode in the first groove and on the first gate insulator; a second gate insulator extending alongside the second side surface; a second gate electrode in the first groove and on the second gate insulator, the second gate electrode being separate from the first gate electrode; a first isolation conductor in the second groove; a second isolation conductor in the third groove; a first diffusion region underneath the bottom of the first groove; a second diffusion region in a shallower portion of the semiconductor substrate and between the first and second grooves; a third diffusion region in the semiconductor substrate and near the top of the second side surface; a first channel region near the first side surface of the first groove and between the first and second diffusion regions; and a second channel region near the second side surface of the first groove and between the first and third diffusion regions.

BRIEF DESCRIPTION OF THE DRAWINGS

The above features and advantages of the present invention will be more apparent from the following description of certain preferred embodiments taken in conjunction with the accompanying drawings, in which:

FIG. 5A is a fragmentary plan view, taken along an A-A' line of FIG. 4A, of a step, subsequent to the step of FIGS. 4A, 4B and 4C, involved in the method of forming the semiconductor device of FIGS. 1A, 1B, and 1C, in accordance with one or more embodiments of the present invention;

FIG. 6C is a fragmentary plan view, taken along a B-B' line of FIG. 6A, of the step, subsequent to the step of FIGS. 5A and 5B, involved in the method of forming the semiconductor device of FIGS. 1A, 1B, and 1C, in accordance with one or more embodiments of the present invention;

DETAILED DESCRIPTION OF THE PREFERRED EMBODIMENTS

Figure 1A:
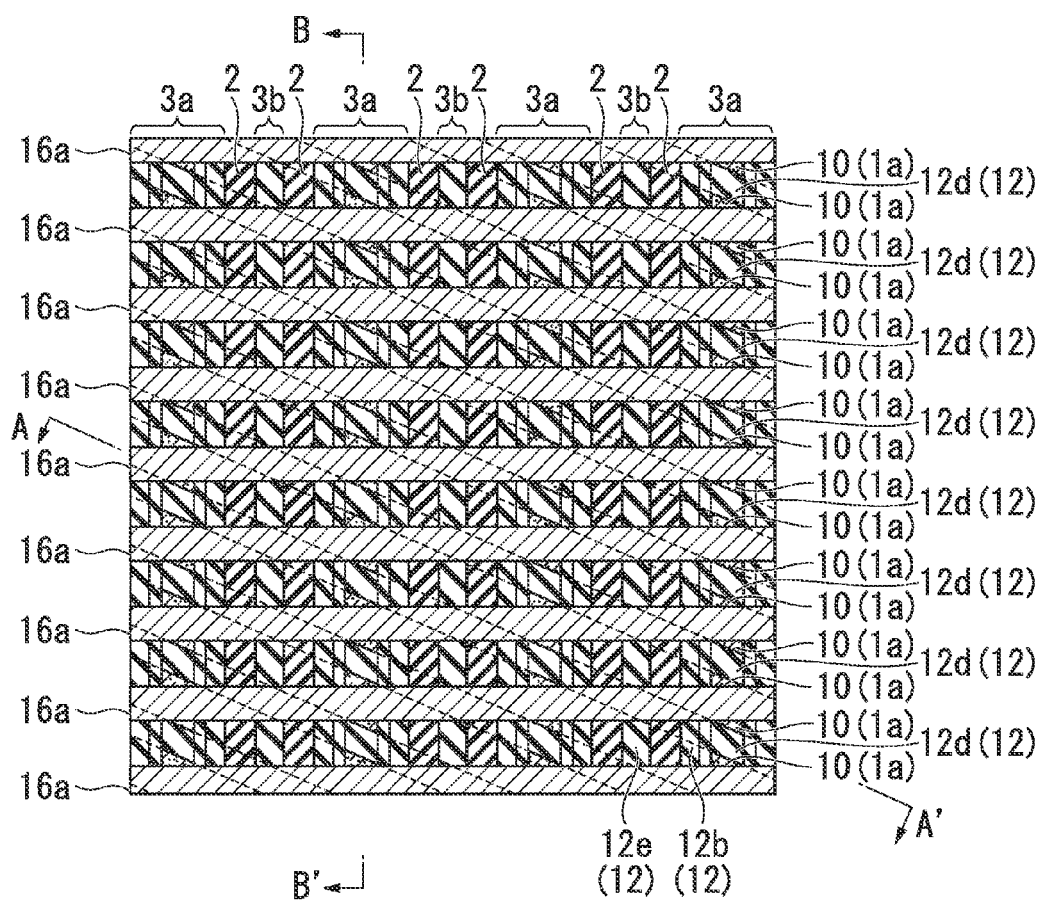
FIG. 1A is a fragmentary plan view of a semiconductor device in accordance with one or more embodiments of the present invention.

Before describing the present invention, the related art will be explained, in order to facilitate the understanding of the present invention.

In the DRAM that uses the above-mentioned trench gate transistor as the cell transistors (cell array access transistors), a transistor is formed by one gate electrode that is formed in one trench, and two source/drain diffusion layers formed on the substrate surface on both sides of that trench. Two source/drain diffusion layers are formed to sandwich one trench gate electrode, so that further nanoscaling was difficult. The structure is such that the gate electrode protrudes from the main surface of the semiconductor substrate and that the space between the first gate electrode and the second gate electrode is very narrow.

For these reasons, it was difficult to form, between the first gate electrode and the second gate electrode, a bit line contact plug that makes contact with the impurity diffusion region and that also is connected to the bit line positioned at the top layer.

A structure that can be envisioned to avoid these types of problems is one that has a gate electrode (word line) that is formed inside the trench formed in the semiconductor substrate and has an upper end surface that is disposed below the main surface of the semiconductor substrate, and an insulating film that buries a trench positioned over the gate electrode and also that does not protrude outwardly from the main surface of the semiconductor substrate.

By completely burying the gate electrode that will serve as a word line inside the semiconductor substrate in this manner, it is easy to form a bit line contact plug.

In this case it is possible to proceed with the nanoscaling of a memory cell of the type in which a gate electrode (word line) is formed only on a side wall on one side inside the trench, and in this case the width of the trench is narrow, and the word line resistance becomes large. For this reason, although the attempt is made to reduce the word line resistance by making the trench depth greater, in this case the bit line contact resistance becoming large and it is difficult to either form the bit line contact or separate the bit line.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate, and first and second transistors in the semiconductor substrate. The semiconductor substrate may have, but not limited to, a first groove. The first groove has a bottom and first and second side surfaces opposite to each other. The first transistor may include, but is not limited to, a first gate insulator extending alongside the first side surface; a first gate electrode in the first groove and on the first gate insulator; a first diffusion region underneath the bottom of the first groove; and a second diffusion region in the semiconductor substrate and near the top of the first side surface. The second transistor may include, but is not limited to, a second gate insulator extending alongside the second side surface; a second gate electrode in the first groove and on the second gate insulator, the second gate electrode being separate from the first gate electrode; the first diffusion region; and a third diffusion region in the semiconductor substrate and near the top of the second side surface.

In some cases, the first transistor further may include, but is not limited to, a first channel region near the first side surface of the first groove and between the first and second diffusion regions. The second transistor further may include, but is not limited to, a second channel region near the second side surface of the first groove and between the first and third diffusion regions.

In some cases, the semiconductor device may further include, but is not limited to, a first insulator being in the first groove and covering the first gate electrode; and a second insulator being in the first groove and covering the second gate electrode.

In some cases, the semiconductor device may further include, but is not limited to, a semiconductor selective growth layer disposed in the first groove and between the first and second gate electrodes. The semiconductor selective growth layer is separated from the first and second gate electrodes by the first and second insulators. The semiconductor selective growth layer is coupled to the first diffusion layer.

In some cases, the semiconductor device may further include, but is not limited to, a bit line contact over the semiconductor selective growth layer and between the first and second gate electrodes. The bit line contact is separated from the first and second gate electrodes by the first and second insulators. The bit line contact is coupled to the semiconductor selective growth layer.

In some cases, the semiconductor device may further include, but is not limited to, a bit line united with the bit line contact.

In some cases, the semiconductor device may further include, but is not limited to, a third insulator comprising first and second portions that cover upper surfaces of the first and second gate electrodes respectively and third and fourth portions covering opposite sides of the semiconductor selective growth layer respectively, the opposite sides being distanced in a direction in which the first groove extends. The third and fourth portions have upper surfaces which are substantially the same in level as an upper surface of the semiconductor selective growth layer.

In some cases, the semiconductor device may further include, but is not limited to, a first isolation conductor in a second groove in the semiconductor substrate. The second groove is narrower than the first groove. The second diffusion region is disposed between the first and second groove.

In some cases, the semiconductor device may further include, but is not limited to, a first pillar defined between the first and second grooves. The second diffusion region is disposed in a top portion of the first pillar.

In some cases, the semiconductor device may further include, but is not limited to, a second isolation conductor in a third groove in the semiconductor substrate. The third groove is narrower than the first groove. The third diffusion region is disposed between the first and second grooves.

In some cases, the semiconductor device may further include, but is not limited to, a second pillar defined between the first and third grooves. The third diffusion region is disposed in a top portion of the second pillar.

In some cases, the first and second isolation conductors are made of a same conductive material as the first and second gate electrodes.

In some cases, the semiconductor device may further include, but is not limited to, a first contact plug coupled to the second diffusion region; a second contact plug coupled to the third diffusion region; a first capacitor coupled to the first contact plug; and a second capacitor coupled to the second contact plug.

In some cases, the first diffusion region is higher in impurity concentration than the second and third diffusion regions.

In some cases, the first diffusion region is lower in flatness of its bottom surface than the second and third diffusion regions.

In another embodiment, a semiconductor device may include, but is not limited to, a semiconductor substrate having a first groove, the first groove having a bottom and first and second side surfaces opposite to each other; a first gate insulator extending alongside the first side surface; a first gate electrode in the first groove and on the first gate insulator; a second gate insulator extending alongside the second side surface; and a second gate electrode in the first groove and on the second gate insulator, the second gate electrode being separate from the first gate electrode.

In some cases, the semiconductor device may further include, but is not limited to, a first insulator in the first groove, the first insulator covering the first gate electrode; a second insulator in the first groove, the second insulator covering the second gate electrode; and a semiconductor selective growth layer in the first groove and between the first and second gate electrodes. The semiconductor selective growth layer is separated from the first and second gate electrodes by the first and second insulators.

In some cases, the semiconductor device may further include, but is not limited to, a bit line contact over the semiconductor selective growth layer and between the first and second gate electrodes. The bit line contact is separated from the first and second gate electrodes by the first and second insulators. The bit line contact is coupled to the semiconductor selective growth layer.

In still another embodiment, a semiconductor device may include, but is not limited to, a semiconductor substrate having first, second and third grooves, the first groove having a bottom and first and second side surfaces opposite to each other, the first groove being positioned between the second and third grooves; a first gate insulator extending alongside the first side surface; a first gate electrode in the first groove and on the first gate insulator; a second gate insulator extending alongside the second side surface; a second gate electrode in the first groove and on the second gate insulator, the second gate electrode being separate from the first gate electrode; a first isolation conductor in the second groove; a second isolation conductor in the third groove; a first diffusion region underneath the bottom of the first groove; a second diffusion region in a shallower portion of the semiconductor substrate and between the first and second grooves; a third diffusion region in the semiconductor substrate and near the top of the second side surface; a first channel region near the first side surface of the first groove and between the first and second diffusion regions; and a second channel region near the second side surface of the first groove and between the first and third diffusion regions.

In some cases, the semiconductor device may further include, but is not limited to, a first insulator in the first groove, the first insulator covering the first gate electrode; a second insulator in the first groove, the second insulator covering the second gate electrode; and a semiconductor selective growth layer in the first groove and between the first and second gate electrodes, the semiconductor selective growth layer being separated from the first and second gate electrodes by the first and second insulators, and the semiconductor selective growth layer being coupled to the first diffusion layer.

As described above, by disposing gate electrodes on both side walls inside the first trench, two vertical transistors are formed having these side walls as channels. One of the source/drain diffusion layer of each of the vertical transistors is formed in the surface of the semiconductor substrate positioned at the up per part of the side wall, and the other source/drain diffusion layer thereof is formed at the bottom part of the first trench positioned at the lower part of the side wall. The bit line contact is also formed between opposing gate electrodes inside the first trench. That is, two transistors and one bit line contact are formed within one trench. It is therefore possible to achieve a great enhancement in nanoscaling compared with a conventional constitution in which formation is done at the left and right when seen in plan view so that two source/drain diffusions layers sandwich one trench gate electrode. Additionally, a constitution in which the second trench that surrounds the isolation layer is formed to be narrower than the first trench in which the word line is buried also contributes to nanoscaling.

Because the present invention is constituted so that the a bit line contact is formed after a semiconductor selective growth layer is formed on the lower diffusion layer to raise the conventional lower diffusion layer, it is possible not only to achieve a good electrical connection between the lower diffusion layer and the bit line contact, but also to reduce the size of the bit line contact and reduced the resistance thereof.

Embodiments

A semiconductor device and method for manufacturing the semiconductor device, which is one embodiment to which the present invention is applied, will be described below, with references made to the drawings. Elements that are the same are assigned the same reference symbols and the description thereof will be either omitted or simplified. On occasion, the reference symbol for elements will be omitted. The drawings used in the following description are schematic in nature, and ratios and the like of the lengths, widths, and thicknesses shown therein are not necessarily the same as in actuality.

Although embodiments will also be described below with aspects of the present invention, the specifically indicated conditions such as materials and dimensions are merely exemplary.

Figure 1B:
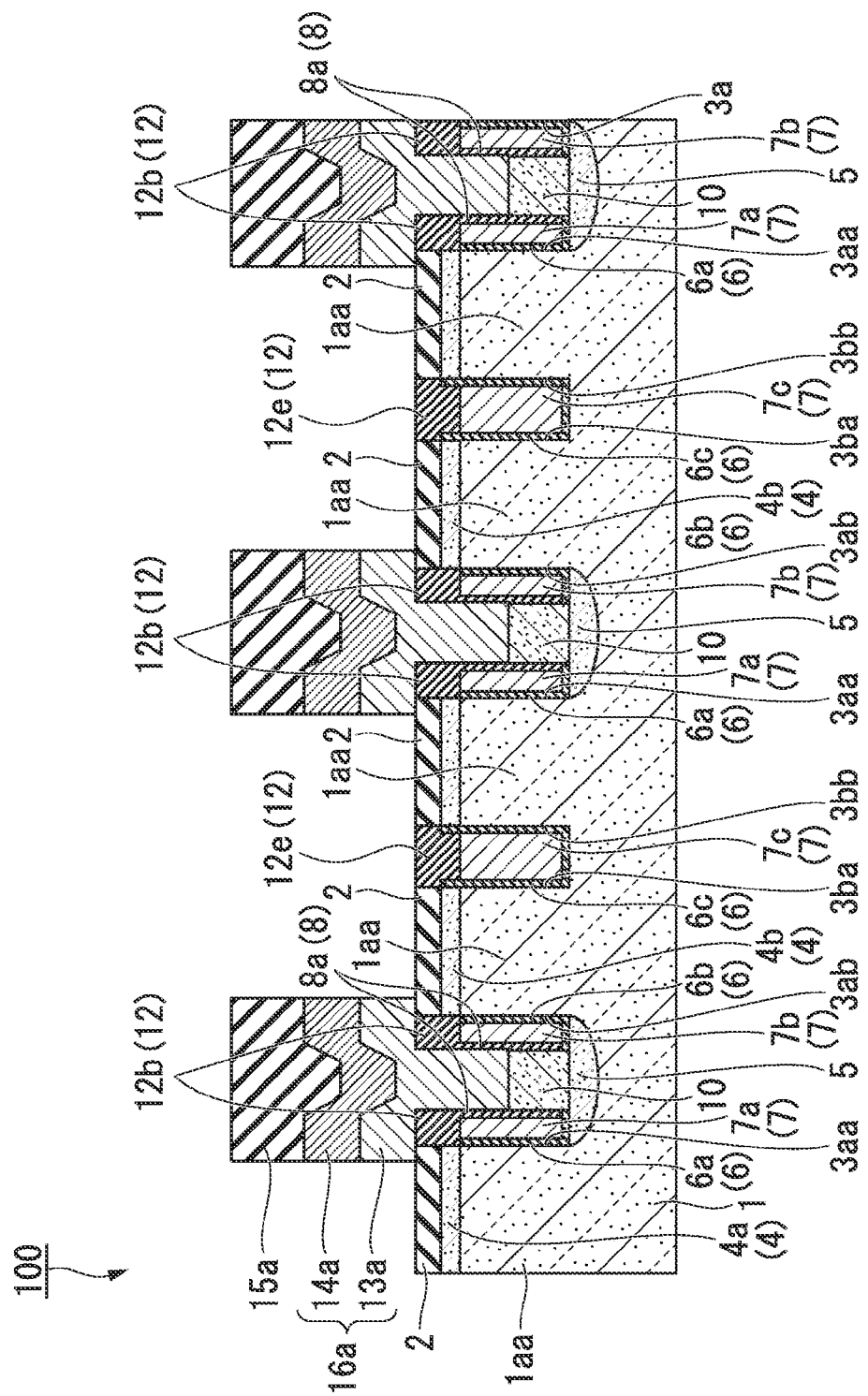
FIG. 1B is a fragmentary cross sectional elevation view, taken along an A-A' line of FIG. 1A, of the semiconductor device.
Figure 1C:
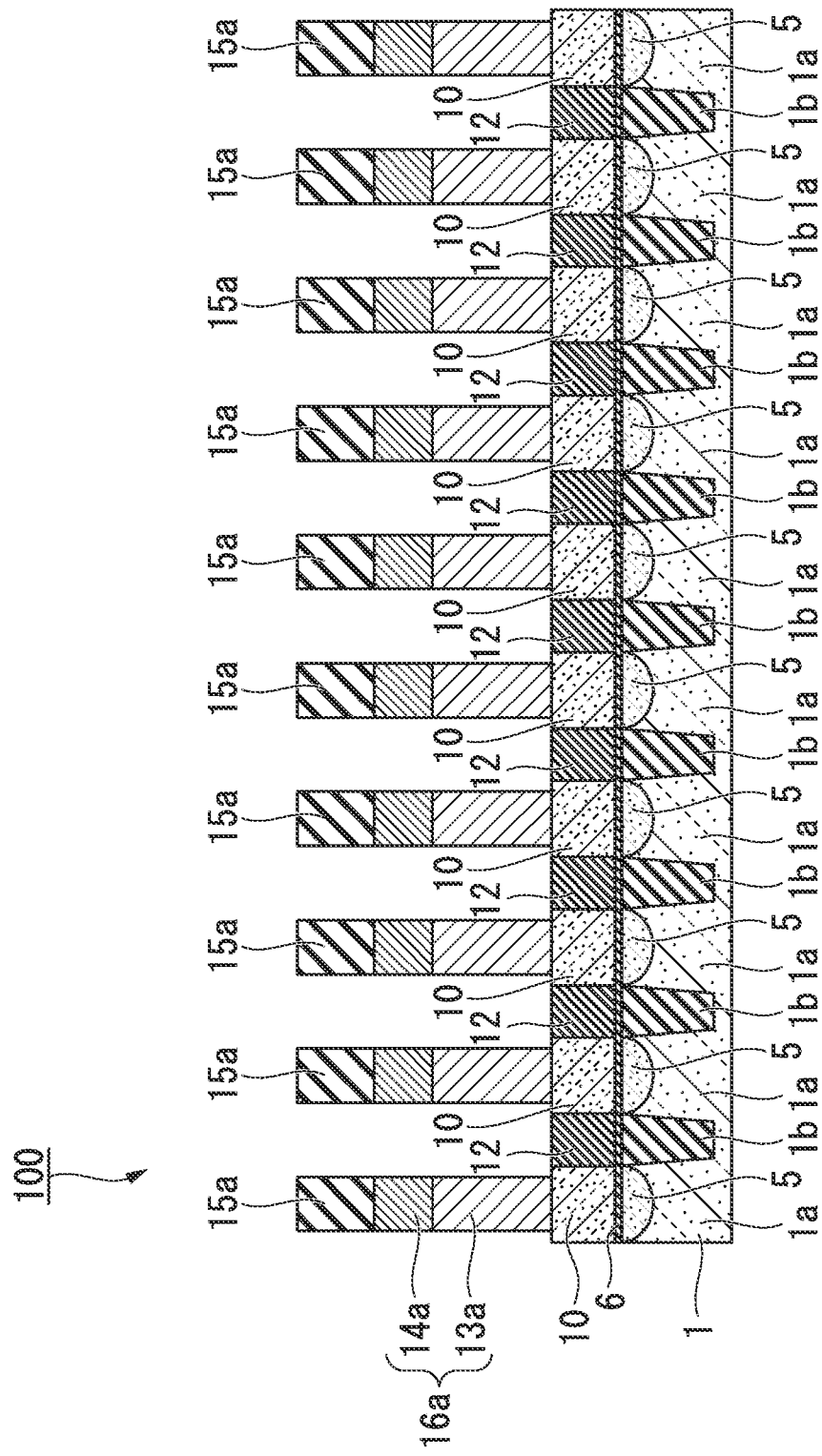
FIG. 1C is a fragmentary cross sectional elevation view, taken along a B-B' line of FIG. 1A, of the semiconductor device.

The structure of a semiconductor memory device (DRAM), which is an example of a semiconductor device to which the present invention shown in FIG. 1A to FIG. 1C is applied, will first be described. The structure shown in the drawings shows only a part of the semiconductor device.

FIG. 1A is a drawing that shows the plan-view layout after the Process of forming the bit lines, to be described later. In FIG. 1A, the dashed lines are the boundaries between active regions (element formation regions) 1a and isolation regions 1b. In FIG. 1A, an insulating film mask 15a that covers bit lines 16a is omitted. In FIG. 1A, the reference symbol 10 (1a) indicates that a semiconductor selective growth layer 10 is formed on the active region (element formation region) 1a, and the reference symbol 12 (1b) indicates that an insulating film (fourth insulating film) 12 is formed on the isolation region 1b. FIG. 1B is a cross-sectional view along the cutting line A-A' in a semiconductor device 100 shown in FIG. 1A, and FIG. 1C is a cross-sectional view along the cutting line B-B' in the semiconductor device 100 shown in FIG. 1A.

Figure 11A:
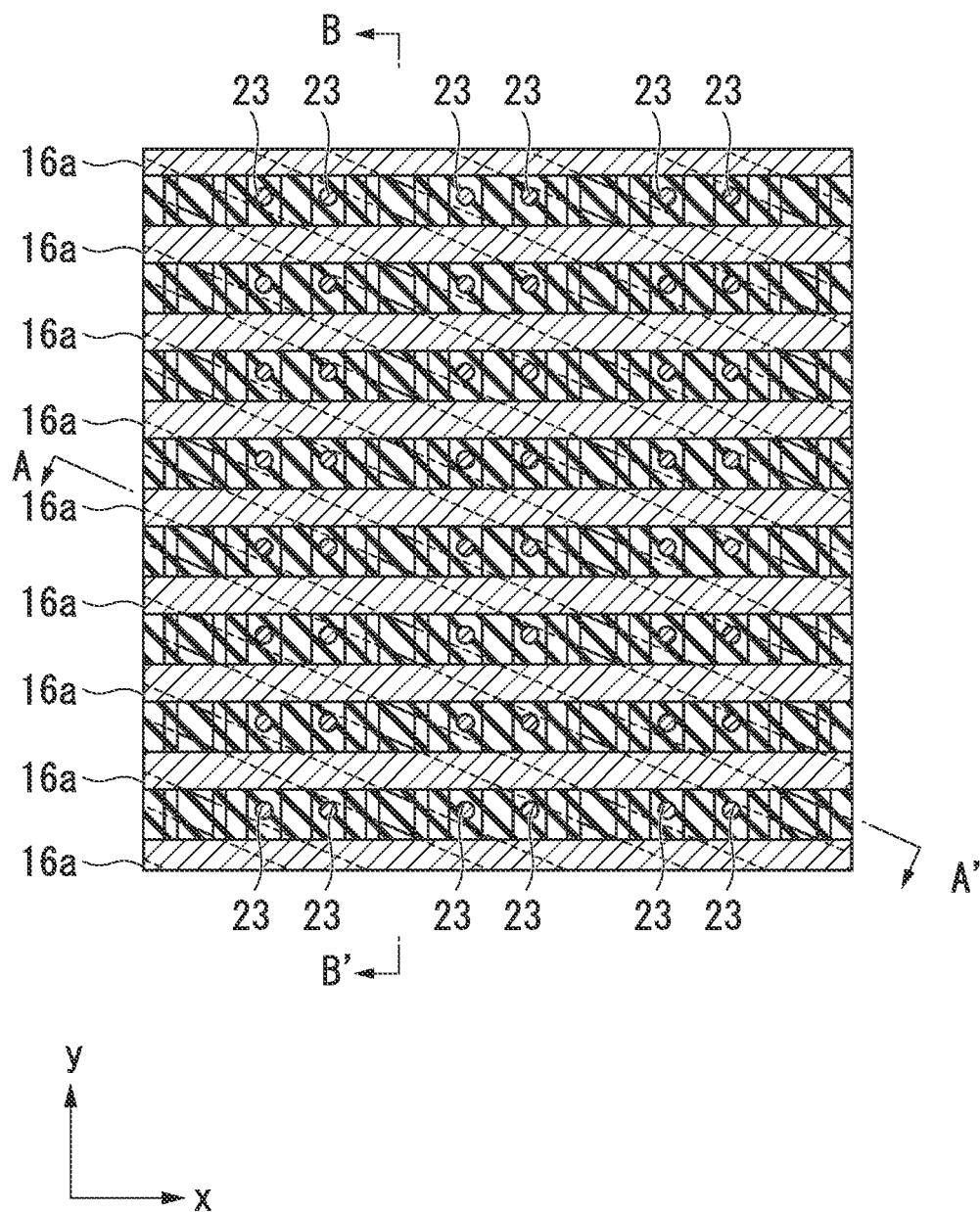
FIG. 11A is a fragmentary plan view of a step, subsequent to a step of FIG. 10, involved in the method of forming the semiconductor device of FIGS. 1A, 1B, and 1C, in accordance with one or more embodiments of the present invention.
Figure 11B:
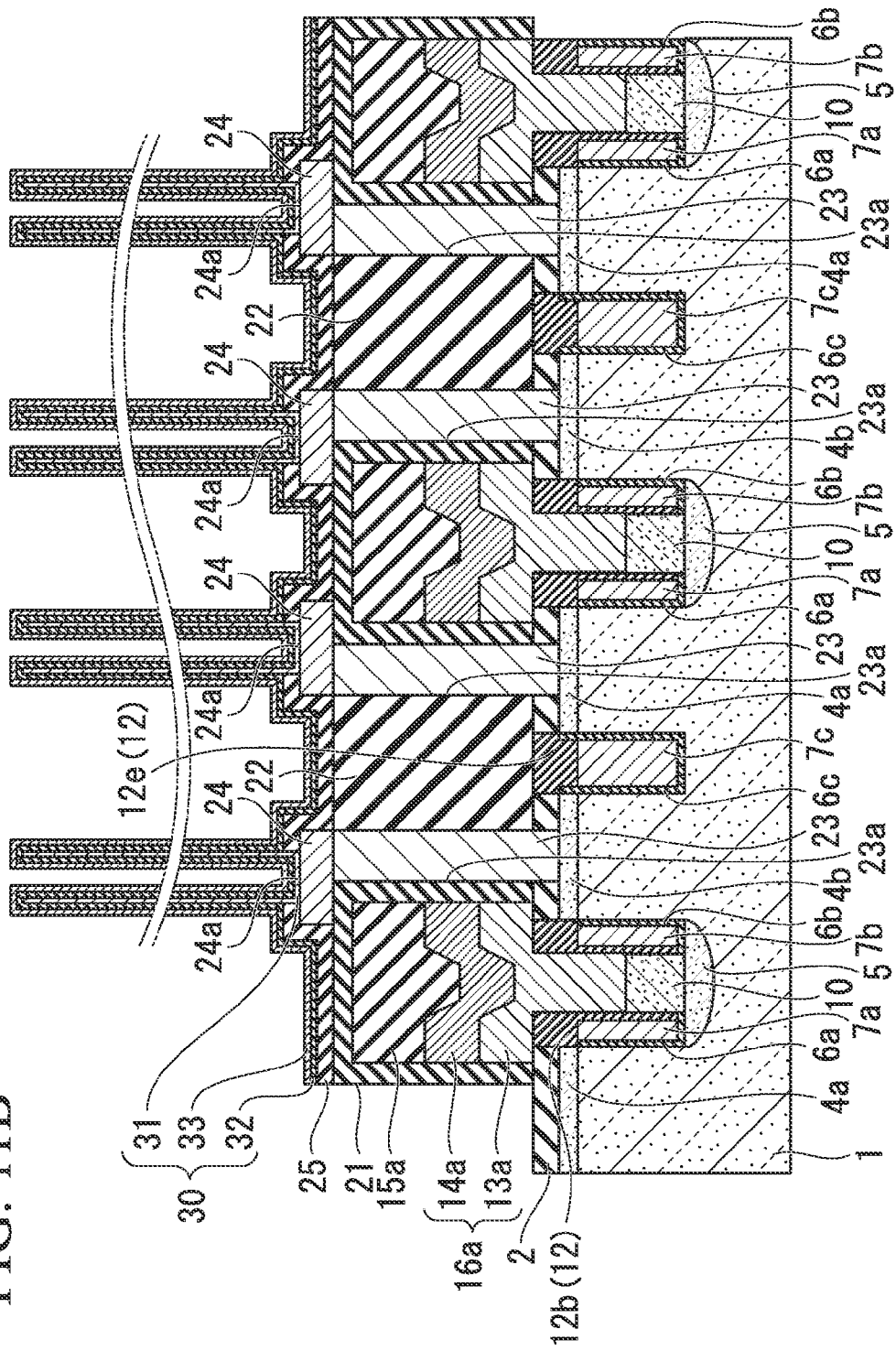
FIG. 11B is a fragmentary plan view, taken along an A-A' line of FIG. 11A, of the step, subsequent to the step of FIG. 10, involved in the method of forming the semiconductor device of FIGS. 1A, 1B, and 1C, in accordance with one or more embodiments of the present invention.

The semiconductor device 100 ultimately functions as a DRAM, and each memory cell thereof has a MOS transistor having a source region 4a or 4b made of an upper diffusion layer, a drain region 5 made of a lower diffusion layer, and a gate electrode (word line) 7a, and a capacitor 30 (refer to FIG. 11B).

The semiconductor device 100 has a plurality of isolation trenches extending in an inclined direction (third direction) that intersects with both the x direction (second direction) and the y direction (first direction), a plurality of isolation regions 1b formed by burying an insulating film in these isolation trenches, and a plurality of element formation regions 1a formed between neighboring isolation regions 1b.

The shapes and extension directions of the isolation regions 1b and element formation regions 1a are only one example.

A semiconductor substrate 1 is a substrate that includes an impurity of a prescribed concentration, for example, a p-type single-crystal silicon substrate, and the isolation regions 1b shown in FIG. 1A, as shown in FIG. 1C, have an STI (shallow trench isolation) structure, in which an insulating film is buried in a trench formed on the semiconductor substrate 1, the element formation regions 1a being active regions that are insulated and separated by these isolation regions 1b.

In each of the element formation regions 1a, a plurality of semiconductor pillars 1aa (refer to FIG. 1B) are arranged in a row along the third direction, these being provided uprightly with respect to the main surface of the semiconductor substrate 1.

The semiconductor pillar 1aa has an upper diffusion layer (upper impurity diffusion region) 4a or 4b that will serve as the source region at the upper part, and a lower diffusion layer (lower impurity diffusion region) 5 that extends from the bottom surface 3A of a first trench 3a toward the inside of the semiconductor substrate 1 and that will serve as the drain region. As shown in FIG. 1B, the lateral direction width of the lower diffusion layer 5 is the same as the lateral direction width of the bottom surface 3A of the first trench 3a. The bottom surface of the upper diffusion layer 4a or 4b is flat, and the bottom surface of the lower diffusion layer 5 is a curved surface. The upper surface of the semiconductor pillar 1aa is covered by an insulating film 2.

Referring to FIG. 1A and FIG. 1B, the semiconductor substrate 1 has trenches 3 (3a, 3b) that extend in the y direction and are alternately spaced in the x direction, so as to cut across the isolation regions 1b and the element formation regions (active regions) 1a. A second trench 3b is constituted so as to have an x-direction width that is narrower than the first trench 3a, for the purpose of nanoscaling the semiconductor device.

Each of two side walls 3aa and 3ab constituting the first trench 3a have formed thereon gate insulating films 6a and 6b, respectively. Additionally, the word lines 7a and 7b, which will serve as gate electrodes of different transistors, are formed so as to oppose the side walls 3aa and 3ab, with the gate insulating films 6a and 6b intervening therebetween. That is, two gate electrodes that constitute different transistors are disposed within one trench made of the first trench 3a.

A first vertical transistor, which is constituted by the upper diffusion layer 4a which will serve as the source region, the gate insulating film 6a, the gate electrode 7a, and the lower diffusion layer 5 that will serve as the drain region, is formed on one side wall 3aa. A second vertical transistor, which is constituted by the upper diffusion layer 4b which will serve as the source region, the gate insulating film 6b, a gate electrode 7b, and the lower diffusion layer 5 that will serve as the drain region, is formed on the other side wall 3ab.

The lower diffusion layer 5 that will serve as the drain region is common to two vertical transistors. The surface of the semiconductor substrate 1 that forms the side wall 3aa will serve as the channel region of the first vertical transistor. The surface of the semiconductor substrate 1 that forms the side wall 3ab will serve as the channel region of the second vertical transistor.

In this embodiment, two side walls and a bottom surface that constitute one trench can be used to dispose two vertical transistors.

An isolation conductive layer 7c made of the same material as the word lines 7a, 7b is buried in the second trench 3b. The isolation conductive layer 7c does not function as a transistor word line, but rather is a so-called dummy word line. A bias voltage having a polarity that is the reverse of the bias voltage applied to the word lines 7a, 7b is applied to the isolation conductive layer 7c so that an inverted layer does not form on the surface of the semiconductor substrate 1 that forms the second trench 3b. For example, because the semiconductor substrate 1 in this embodiment is a p-type semiconductor, by applying a positive bias voltage to the word line 7a an n-type channel made of an inverted layer is formed on the surface of the semiconductor substrate 1 that forms the side wall 3aa, the drain region 5 made of an n-type diffusion layer, the same as the source region 4a made of an n-type diffusion layer is connected, and the transistor is placed in the on state. In the case of an n-type semiconductor substrate 1, the transistor would go into the on state by reversing the n and p relationships noted above. If a positive bias voltage is applied to the isolation conductive layer 7c as well at the above-noted operation of the transistor, an inverted layer is formed on the semiconductor substrate 1 that forms the second trench 3b. As a result, the source regions 4a and 4b that are neighboring and sandwich the isolation conductive layer 7c short to one another via the inverted layer, leading to the problem of difficulty in operating the transistor. It is therefore necessary to apply a bias voltage having a polarity that is the reverse of the bias voltage applied to the word lines 7a, 7b to the isolation conductive layer 7c so that an inverted layer does not form on the surface of the semiconductor substrate 1 that forms the second trench 3b.

Also, although the second trench 3b is formed so that it has an x-direction width that is narrower than that of the first trench 3a, that does not contribute to the reduction in the overall size of the semiconductor device, but has an important role in achieving a constitution in which a diffusion layer is not formed on the bottom surface of the second trench 3b. After forming the gate electrode on the side walls 3aa and 3ab of the first trench 3a, the lower diffusion layer 5 is formed by ion implantation. When this is done, if the width of the second trench 3b on which the isolation conductive layer 7c is formed is made the same as the width of the first trench 3a, a lower diffusion layer 5 is formed on the bottom surface of the trench, similar to the case of the first trench 3a. That is, the constitution is one in which an n-type conductor is disposed on the bottom surface of the second trench. In this condition, there is incomplete insulation separation of neighboring transistors sandwiching the isolation conductive layer 7c, and shorts therebetween easily occur. In the present embodiment, in order to solve this problem, the constitution is made such that the width of the second trench 3b is narrower than the width of the first trench. Specifically, the width is made such that, at the stage of depositing the word lines 7 (7a, 7b) that will serve as the gate electrodes, the second trench 3b is completely buried. That is, the width is made narrower than two times the thickness of the word lines 7. For example, if the thickness of the word lines is 30 nm, the x-direction width of the second trench 3b is made 40 to 50 nm. By doing this, the second trench 3b is completely buried at the stage at which the word lines 7 are deposited. Therefore, even if ion implantation is subsequently done, because the buried dummy word line 7c forms a block, the implanted impurity cannot reach as far as the bottom surface of the second trench 3b, so that a diffusion layer is not formed.

The word line 7a is formed on the side wall 3aa of the first trench 3a, with the gate insulating film (second insulating film) 6a intervening therebetween, and is covered by a third gate insulating film 8 and the insulating film (fourth insulating film) 12. Because the first trench 3a and the second trench 3b are alternately disposed, with the semiconductor pillar 1aa seen as being at the center, the word line 7 is formed on only one of the side walls of the two side walls that are parallel to the y direction, this being a single side wall gate structure. Stated differently, of the two side walls that are parallel to the y direction of the semiconductor pillar 1aa, a word line 7 is formed on one of the side walls, with the second insulating film 6 intervening therebetween, and the isolation conductive layer 7c is formed on the other of the side walls, with the second insulating film 6 intervening therebetween. For example, in FIG. 1B, of the two word lines 7a, 7b provided within the first trench 3a illustrated in the center, take note of the right-side word line 7b. If the corresponding semiconductor pillar 1aa is taken to be at the center, the semiconductor pillar 1aa has two opposing side walls 3ab and 3ba. The left-side side wall 3ab has formed thereon the word line 7b, which will serve as a gate electrode, with the gate insulating film 6b intervening therebetween, and the right-side side wall 3ba has formed thereon the isolation conductive layer 7c, with the gate insulating film 6c intervening therebetween.

The semiconductor selective epitaxial growth layer (hereinafter referred to as a selective epitaxial layer) 10 that is electrically connected to the lower diffusion layer 5 is provided on the bottom surface 3A of the first trench 3a. The selective epitaxial layer 10 is connected to a first conductive layer 13a and the bit line 16a thereabove, which is made of a second conductive layer 14a. The selective epitaxial layer 10 can be formed by a single crystal silicon or polycrystal silicon that contains an n-type impurity such as phosphorus or arsenic of approximately $1 \times 10^{20}$ atoms/cm$^3$. The thickness of the selective epitaxial layer 10 is made in the range of ⅓ to ½ of the depth of the first trench 3a. By this constitution, the lower diffusion layer 5a is electrically connected to the bit line 16a. The selective epitaxial layer 10 is insulated from the word line 7 by the third insulating film 8.

The upper surface of the bit line 16a is covered by the insulating film mask 15a.

After the Process of forming the bit line 16a, as shown in FIG. 11, the bit line 16a and the insulating film mask 15a are covered by an insulating film 21, and then the overall surface is covered by an interlayer insulating film 22, after which a capacitor contact hole 23a that passes up through the upper diffusion layers 4a, 4b is opened in the interlayer insulating film 22, a capacitor contact plug 23 is formed that fills the capacitor contact hole 23, a capacitor contact pad 24 is formed thereover, and the capacitor 30 is further formed thereover. After that, an interlayer insulating film, a via, and an interconnect and the like that are not shown in FIG. 11 are formed on the upper surface 33a of an upper electrode 33 of the capacitor 30, thereby manufacturing the semiconductor device 100 of the present embodiment.

In the above-described manner, in the semiconductor device of the present invention, the selective epitaxial layer 10 is formed on the bottom surface 3A of the first trench 3a, so as to reduce the bit line contact resistance commensurately with the amount of raising the bottom surface 3A. Because the selective epitaxial layer 10 is formed by selective epitaxial growth, unevennesses in the bottom surface 3A are effectively covered, thereby contributing to the reduction in the bit line contact resistance.

Although there are actually many memory cells formed and arranged on the above-described element formation region 1a, in the semiconductor device 100 shown in FIG. 1A, because of the difficulty in showing all of these memory cells, the number of memory cells within the element formation region 1a is reduced and shown in schematic form.

Method for Manufacturing a Semiconductor Device

A method for manufacturing a semiconductor memory device (DRAM) that is an example of a semiconductor device that applies the present invention will be described, with references made to FIG. 2A to FIG. 11C.

Figure 2A:
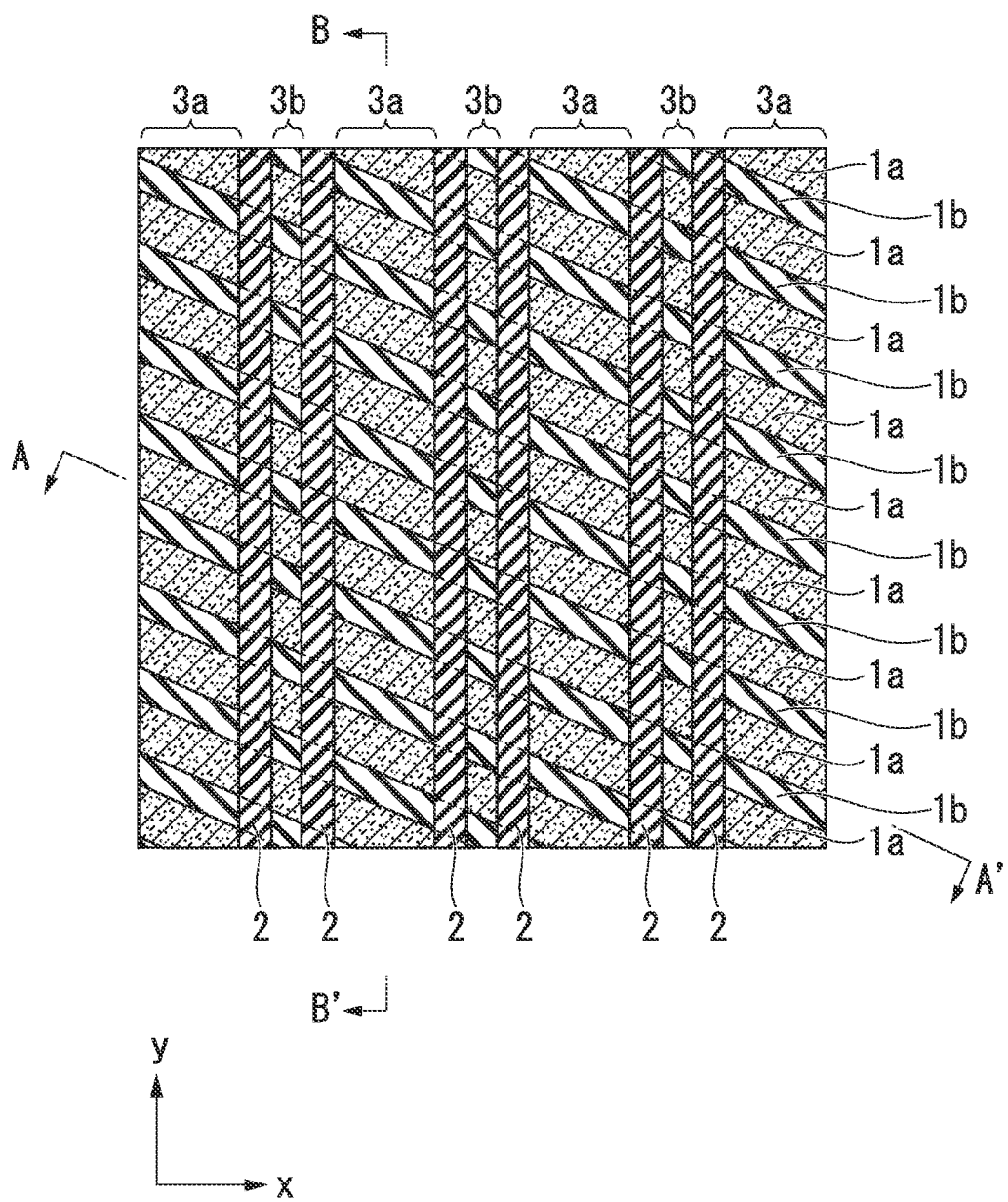
FIG. 2A is a fragmentary plan view of a step involved in a method of forming the semiconductor device of FIGS. 1A, 1B, and 1C, in accordance with one or more embodiments of the present invention.
Figure 2B:
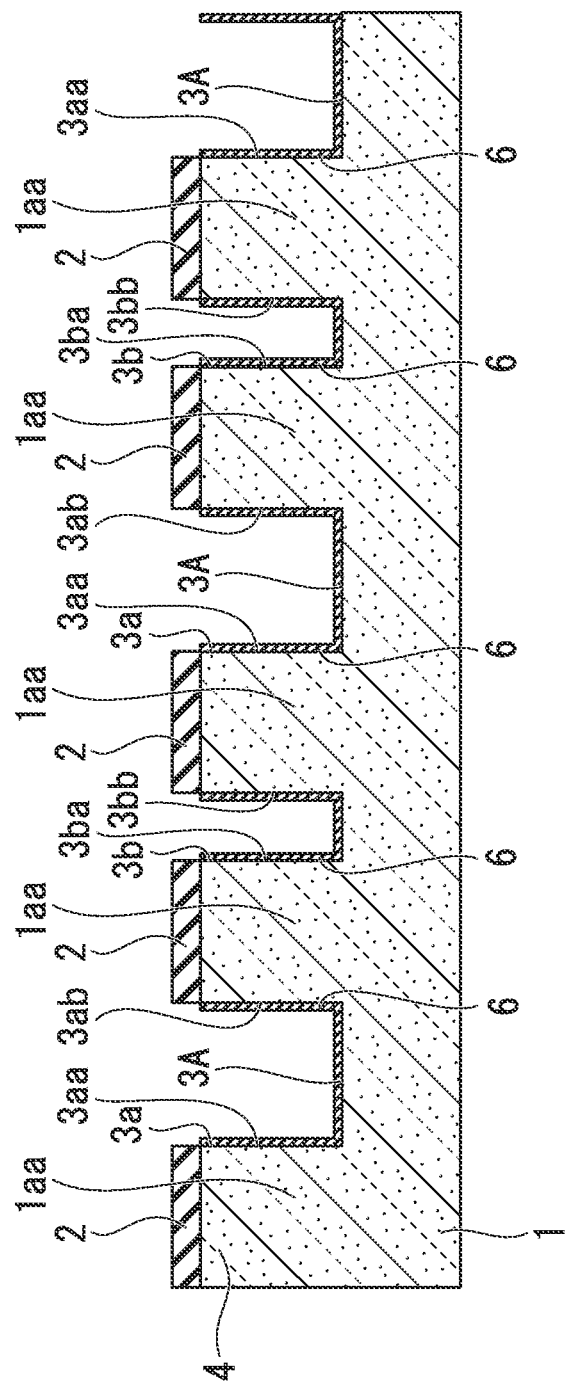
FIG. 2B is a fragmentary plan view, taken along an A-A' line of FIG. 2A, of the step involved in the method of forming the semiconductor device of FIGS. 1A, 1B, and 1C, in accordance with one or more embodiments of the present invention.
Figure 2C:
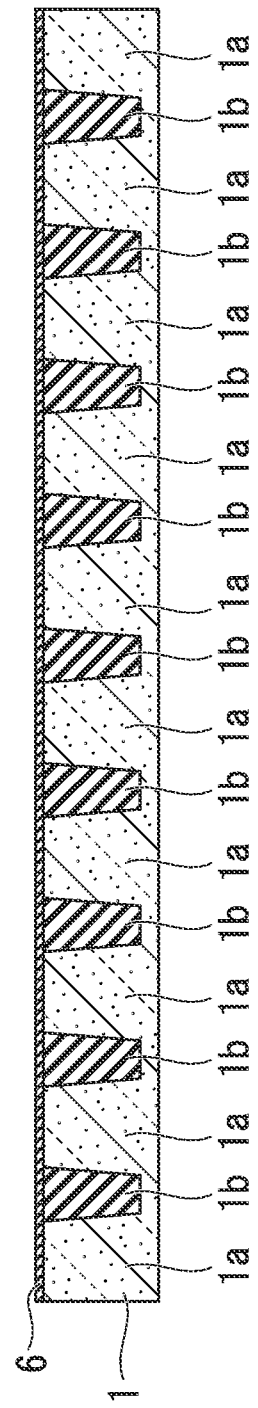
FIG. 2C is a fragmentary plan view, taken along a B-B' line of FIG. 2A, of the step involved in the method of forming the semiconductor device of FIGS. 1A, 1B, and 1C, in accordance with one or more embodiments of the present invention.
Figure 3A:
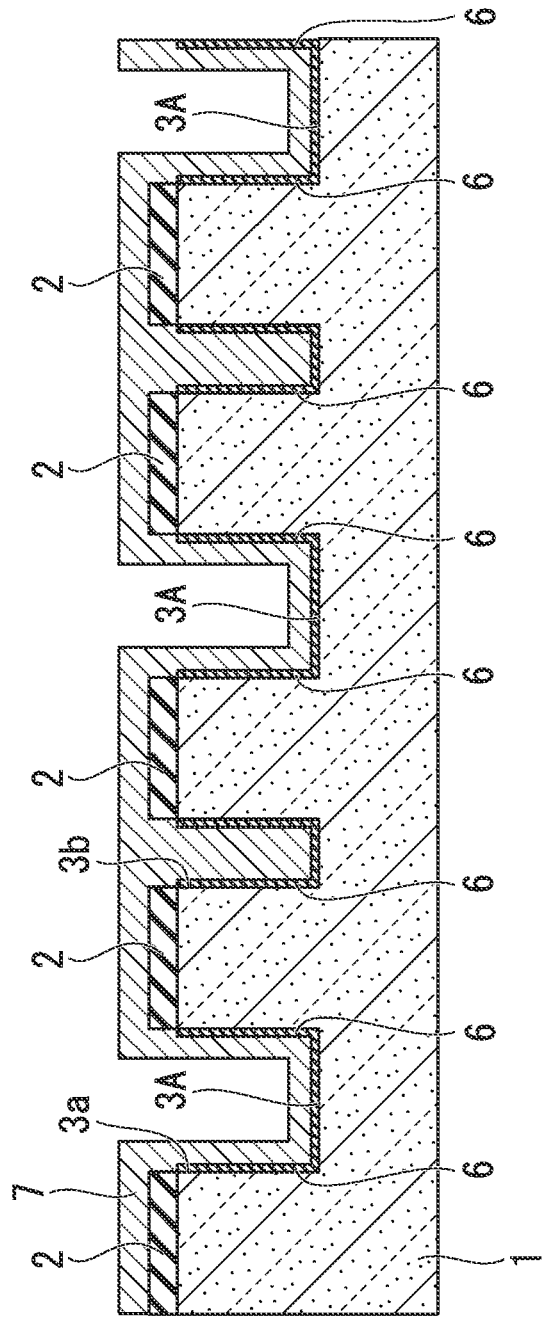
FIG. 3A is a fragmentary plan view, taken along an A-A' line of FIG. 2A, of a step, subsequent to the step of FIGS. 2A, 2B and 2C, involved in the method of forming the semiconductor device of FIGS. 1A, 1B, and 1C, in accordance with one or more embodiments of the present invention.
Figure 3B:
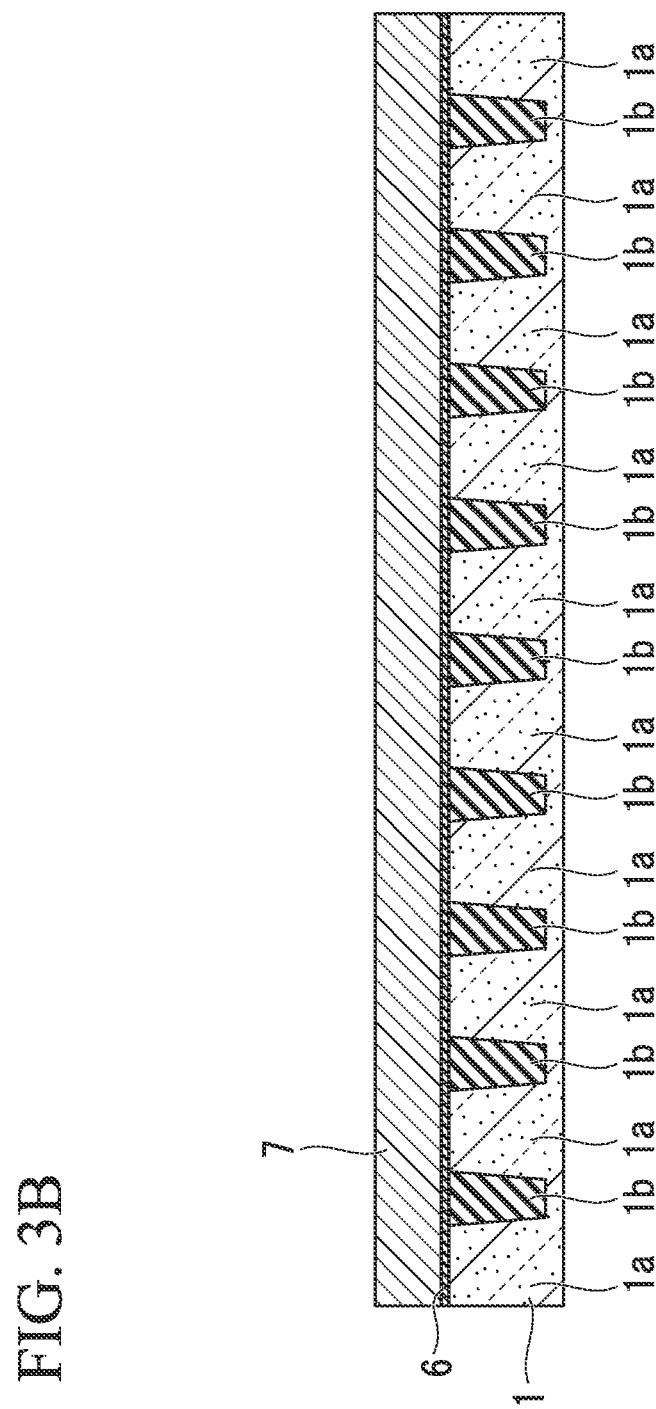
FIG. 3B is a fragmentary plan view, taken along a B-B' line of FIG. 2A, of the step, subsequent to the step of FIGS. 2A, 2B and 2C, involved in the method of forming the semiconductor device of FIGS. 1A, 1B, and 1C, in accordance with one or more embodiments of the present invention.
Figure 4A:
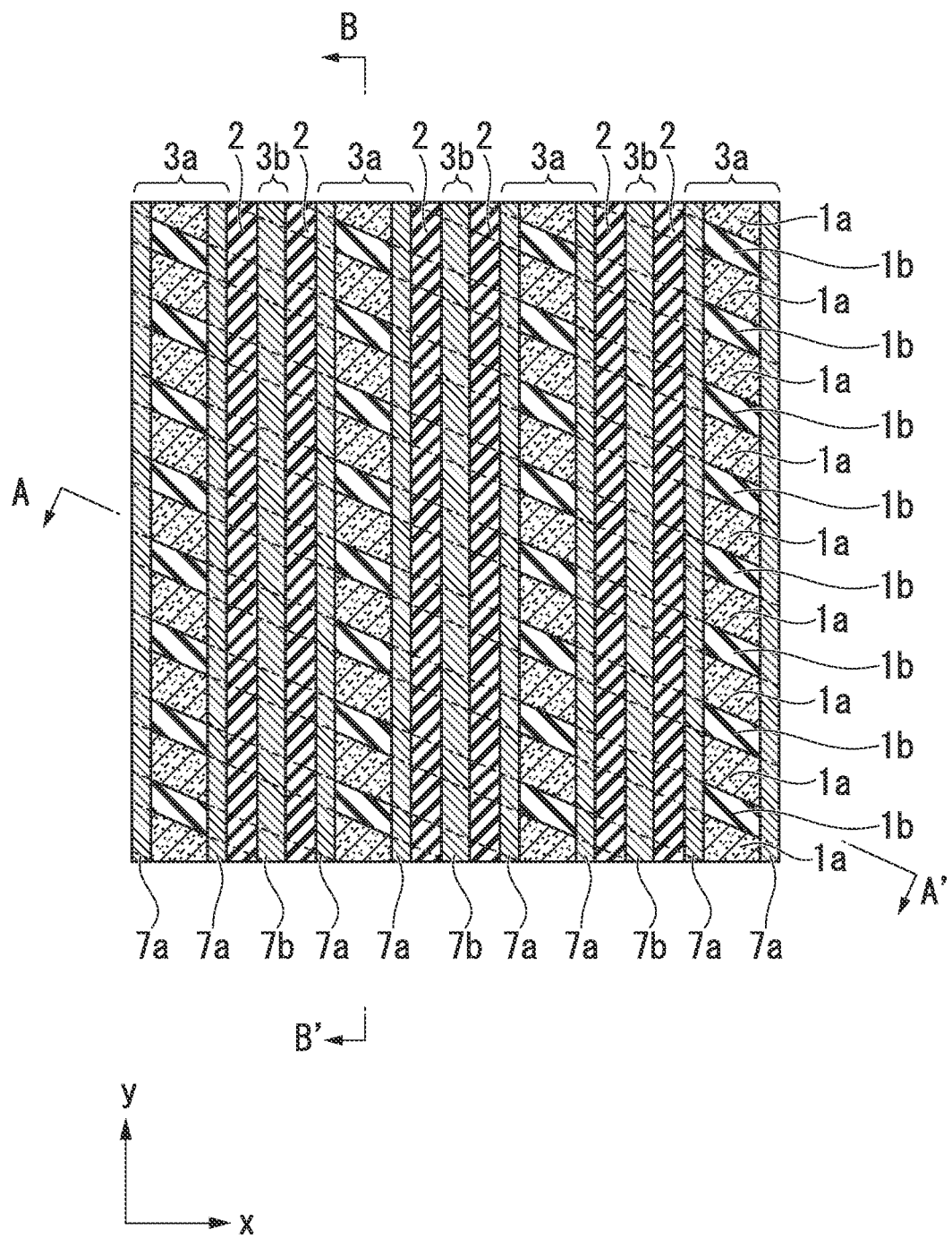
FIG. 4A is a fragmentary plan view of a step, subsequent to a step of FIGS. 3A and 3B, involved in the method of forming the semiconductor device of FIGS. 1A, 1B, and 1C, in accordance with one or more embodiments of the present invention.
Figure 4B:
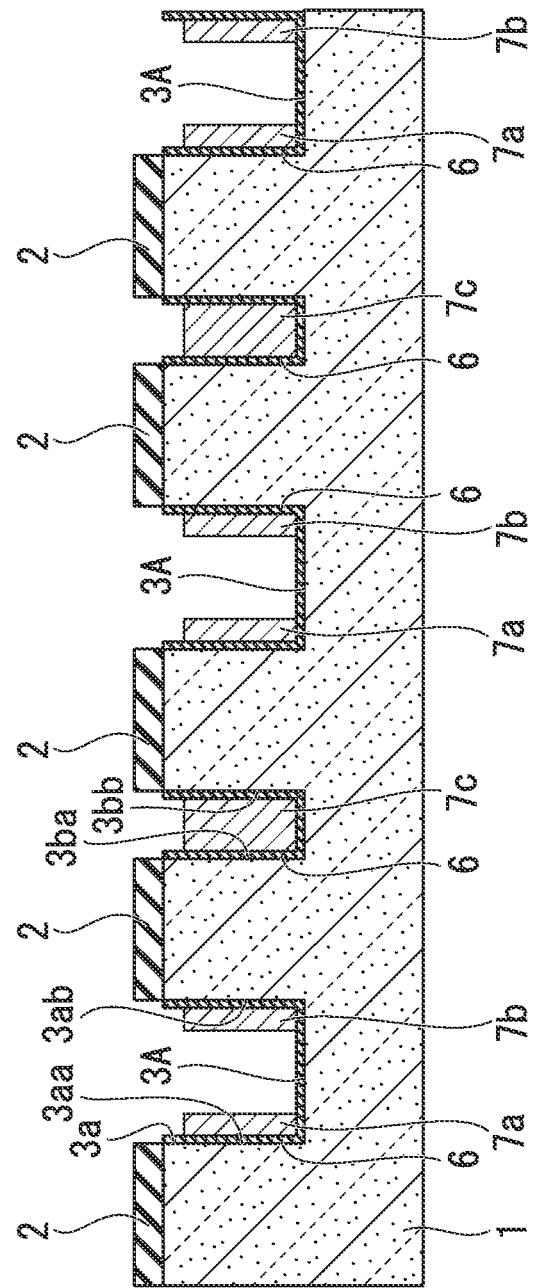
FIG. 4B is a fragmentary plan view, taken along an A-A' line of FIG. 4A, of the step, subsequent to the step of FIGS. 3A and 3B, involved in the method of forming the semiconductor device of FIGS. 1A, 1B, and 1C, in accordance with one or more embodiments of the present invention.
Figure 4C:
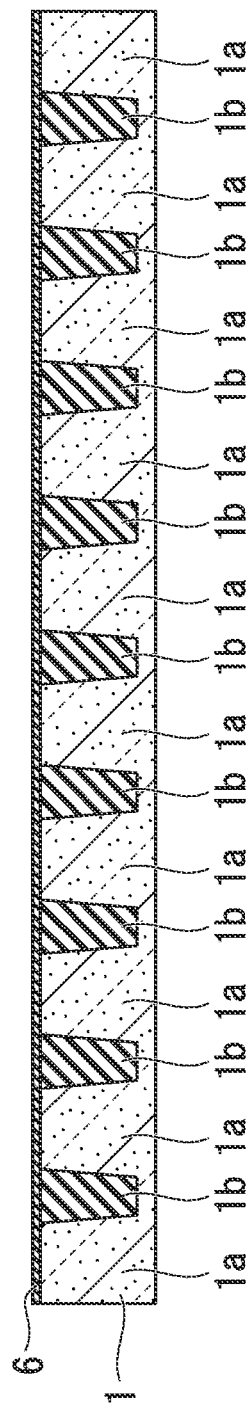
FIG. 4C is a fragmentary plan view, taken along a B-B' line of FIG. 4A, of the step, subsequent to the step of FIGS. 3A and 3B, involved in the method of forming the semiconductor device of FIGS. 1A, 1B, and 1C, in accordance with one or more embodiments of the present invention.
Figure 5B:
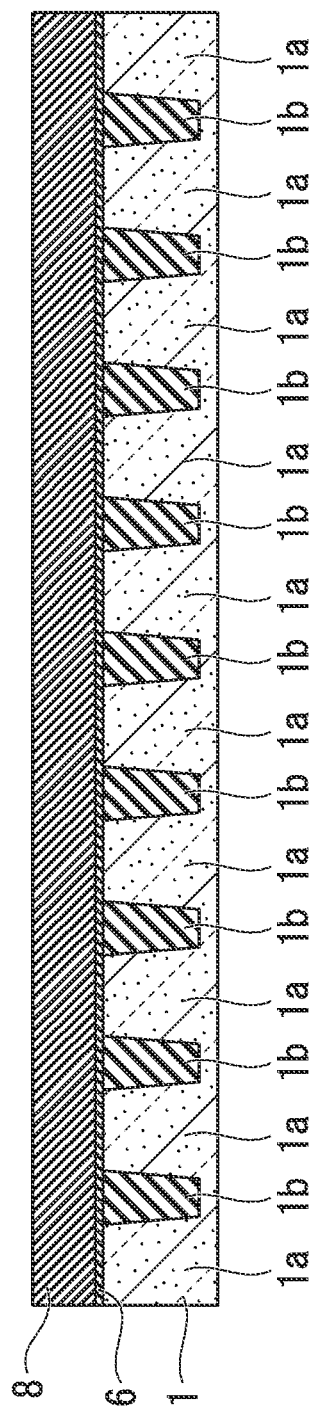
FIG. 5B is a fragmentary plan view, taken along a B-B' line of FIG. 4A, of the step, subsequent to the step of FIGS. 4A, 4B and 4C, involved in the method of forming the semiconductor device of FIGS. 1A, 1B, and 1C, in accordance with one or more embodiments of the present invention.
Figure 6A:
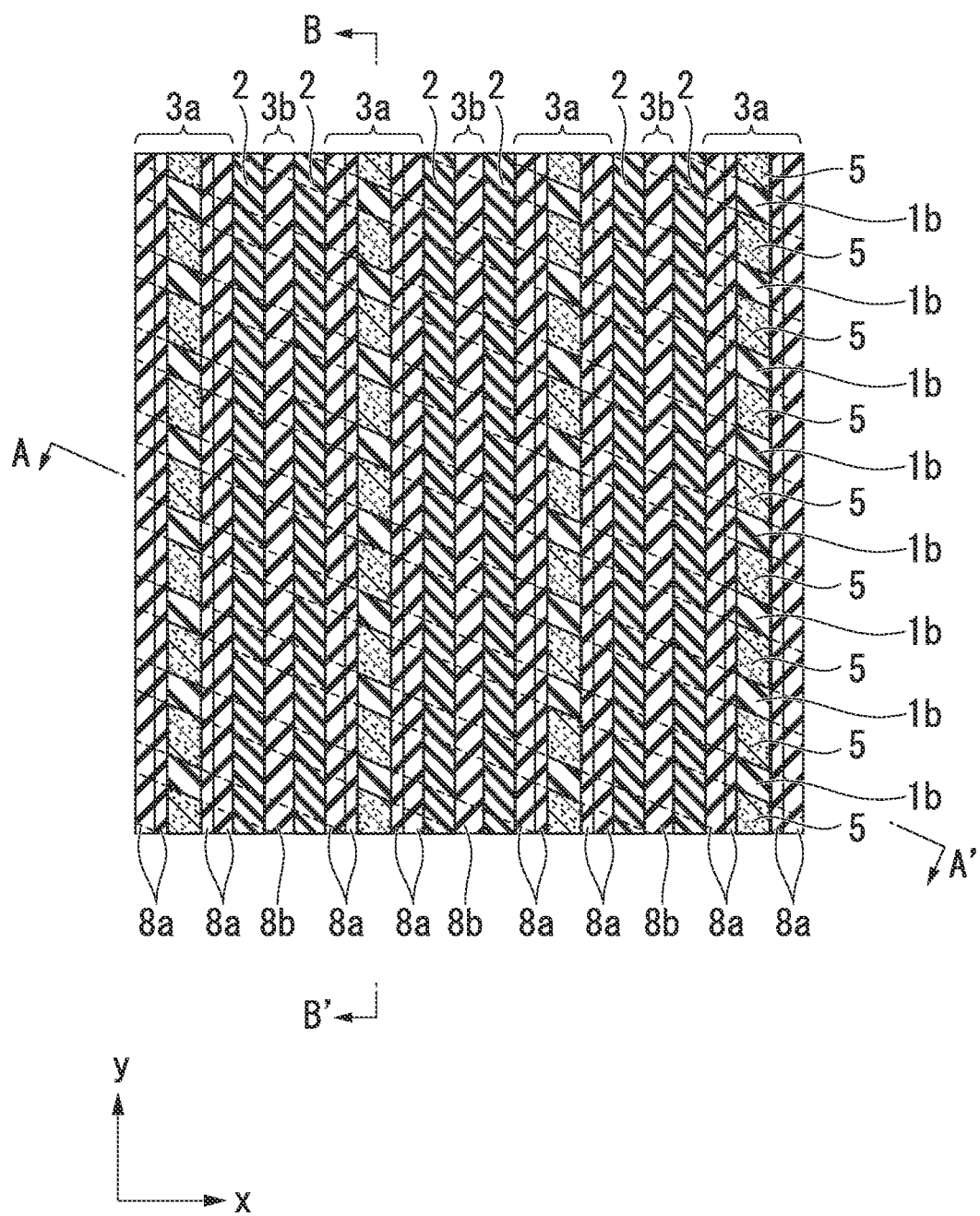
FIG. 6A is a fragmentary plan view of a step, subsequent to a step of FIGS. 5A and 5B, involved in the method of forming the semiconductor device of FIGS. 1A, 1B, and 1C, in accordance with one or more embodiments of the present invention.
Figure 6B:
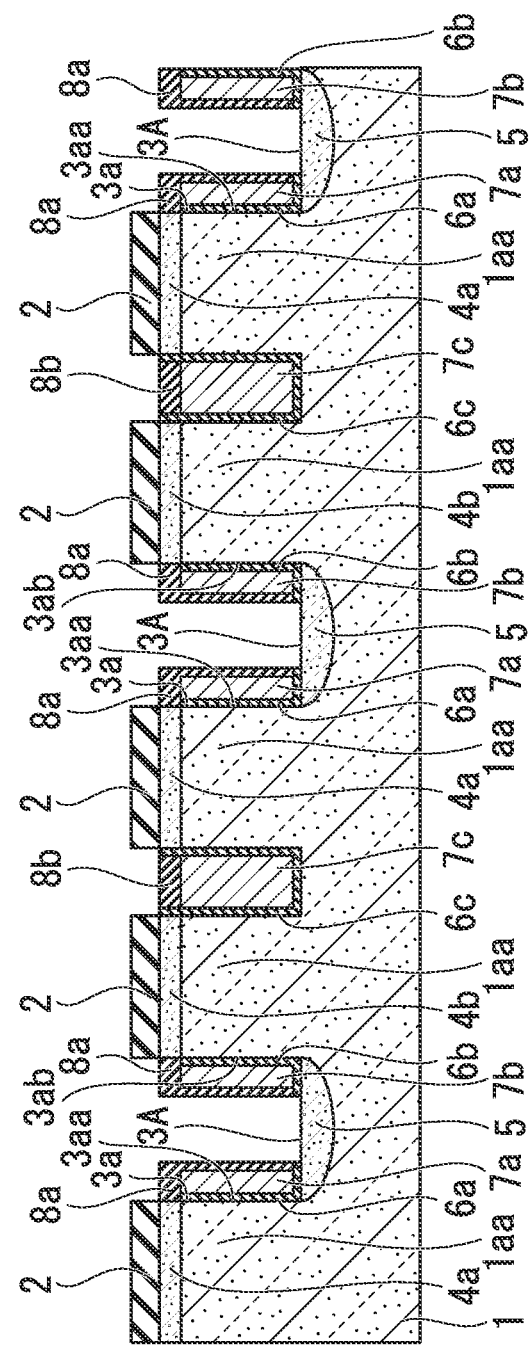
FIG. 6B is a fragmentary plan view, taken along an A-A' line of FIG. 6A, of the step, subsequent to the step of FIGS. 5A and 5B, involved in the method of forming the semiconductor device of FIGS. 1A, 1B, and 1C, in accordance with one or more embodiments of the present invention.
Figure 7A:
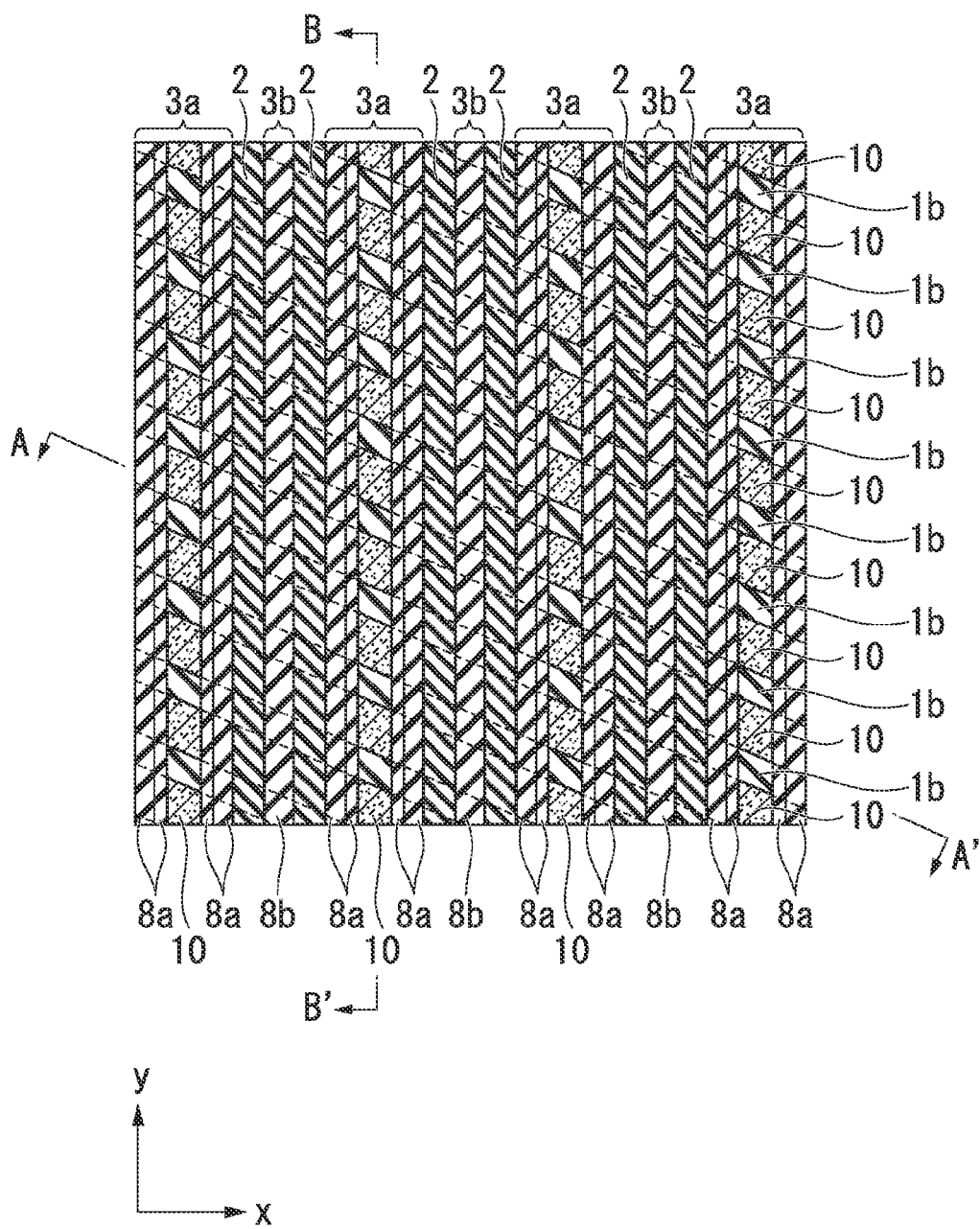
FIG. 7A is a fragmentary plan view of a step, subsequent to a step of FIGS. 6A 6B and 6C, involved in the method of forming the semiconductor device of FIGS. 1A, 1B, and 1C, in accordance with one or more embodiments of the present invention.
Figure 7B:
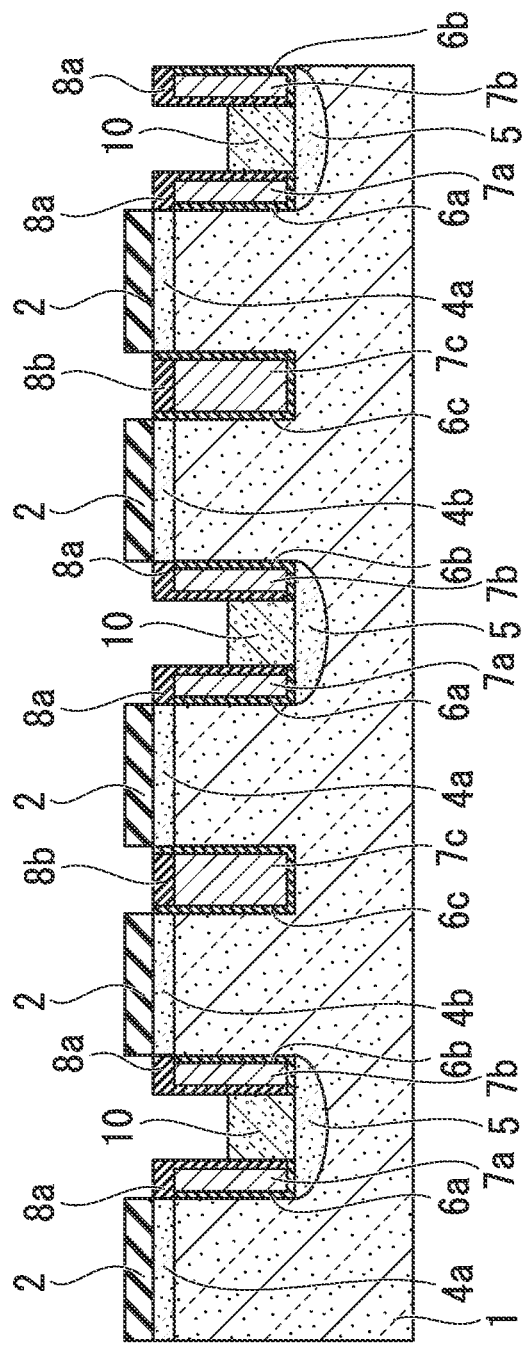
FIG. 7B is a fragmentary plan view, taken along an A-A' line of FIG. 7A, of the step, subsequent to the step of FIGS. 6A 6B and 6C, involved in the method of forming the semiconductor device of FIGS. 1A, 1B, and 1C, in accordance with one or more embodiments of the present invention.
Figure 7C:
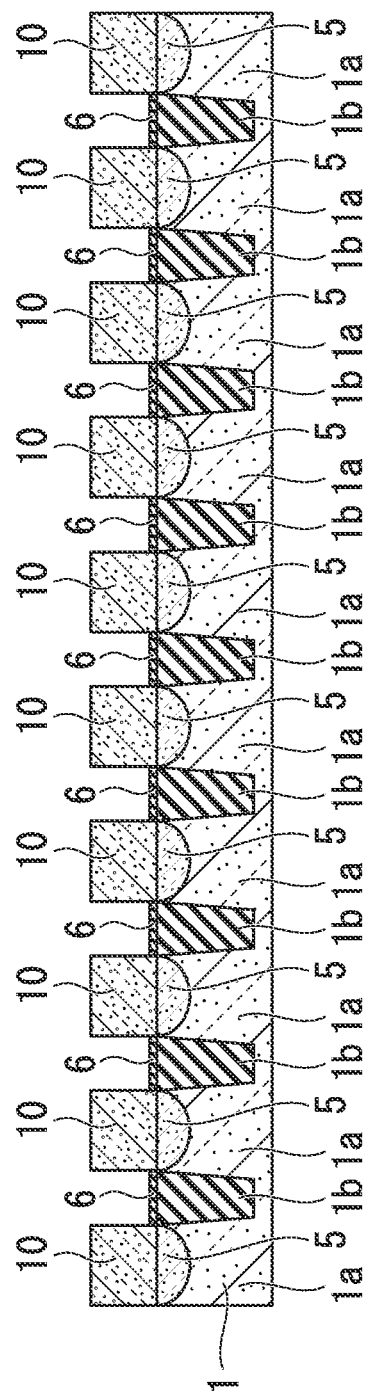
FIG. 7C is a fragmentary plan view, taken along a B-B' line of FIG. 7A, of the step, subsequent to the step of FIGS. 6A 6B and 6C, involved in the method of forming the semiconductor device of FIGS. 1A, 1B, and 1C, in accordance with one or more embodiments of the present invention.
Figure 8A:
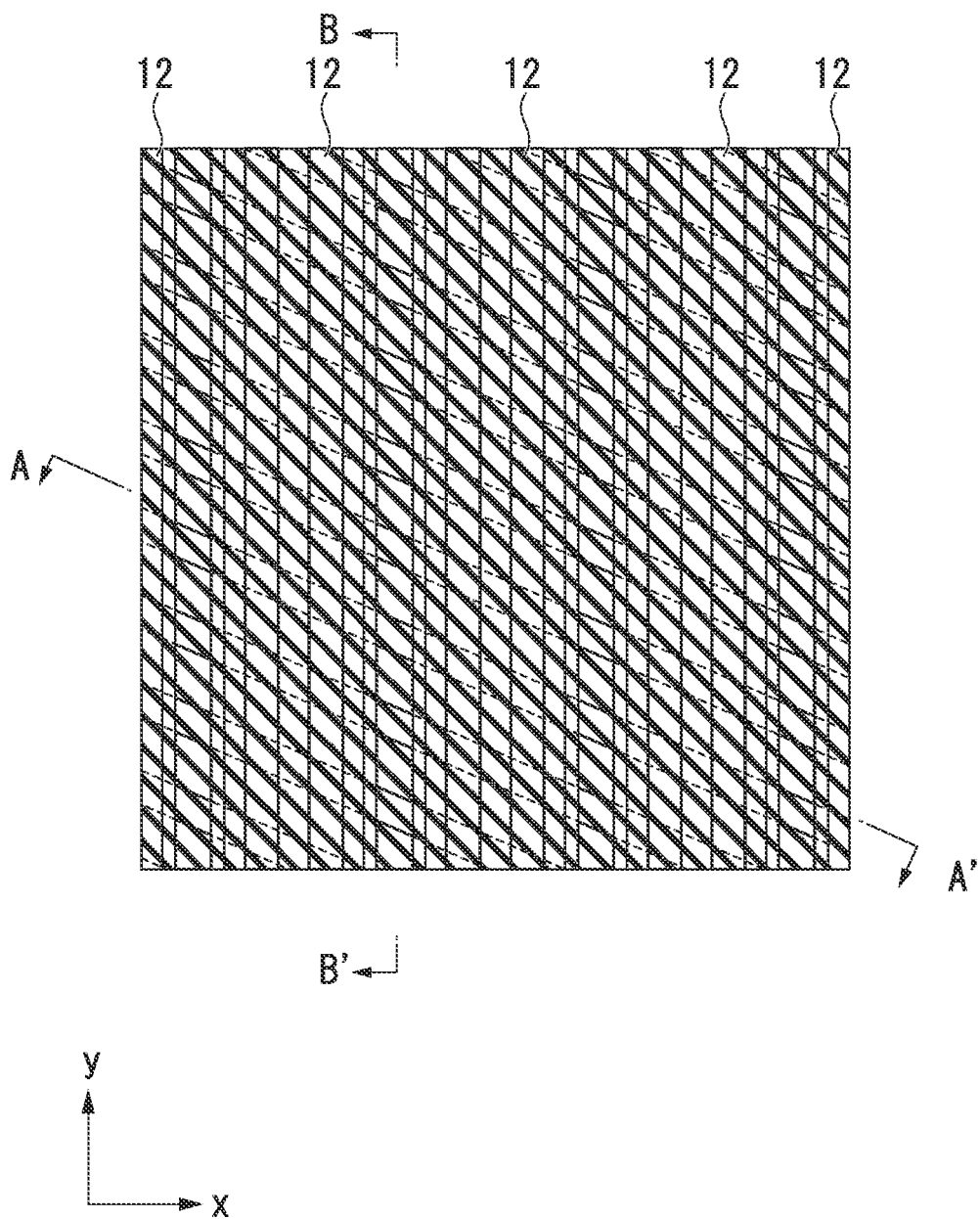
FIG. 8A is a fragmentary plan view of a step, subsequent to a step of FIGS. 7A 7B and 7C, involved in the method of forming the semiconductor device of FIGS. 1A, 1B, and 1C, in accordance with one or more embodiments of the present invention.
Figure 8B:
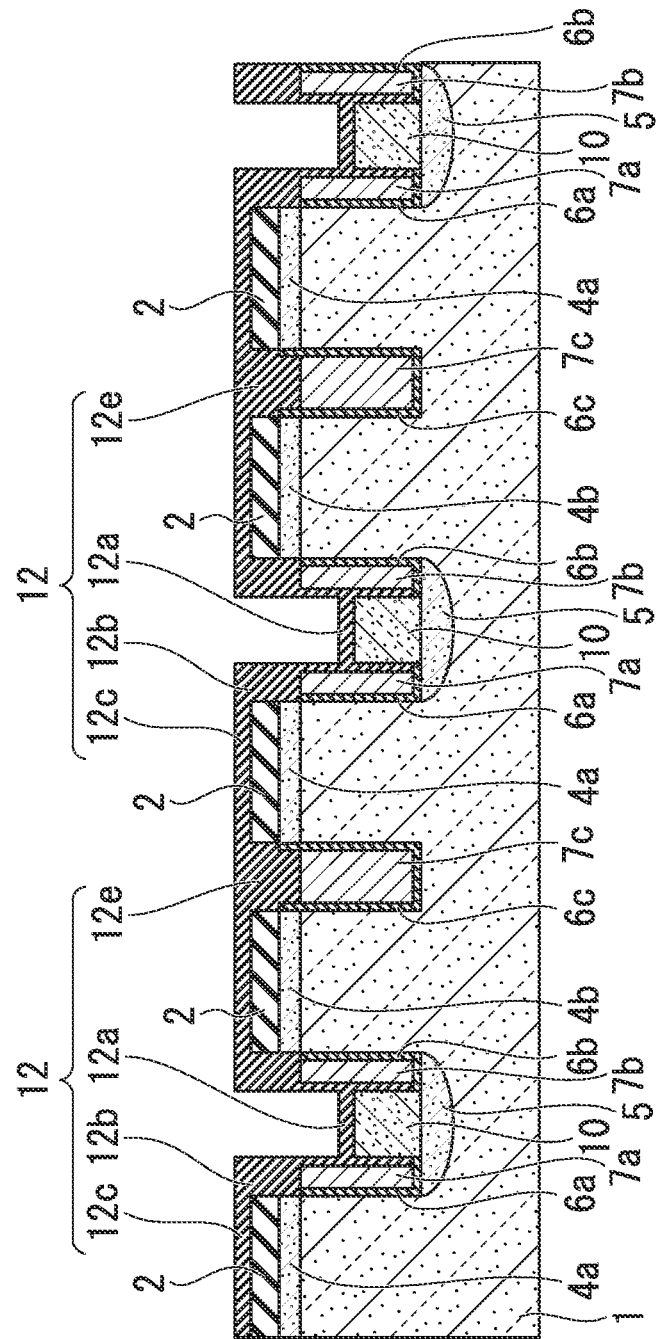
FIG. 8B is a fragmentary plan view, taken along an A-A' line of FIG. 8A, of the step, subsequent to the step of FIGS. 7A 7B and 7C, involved in the method of forming the semiconductor device of FIGS. 1A, 1B, and 1C, in accordance with one or more embodiments of the present invention.
Figure 8C:
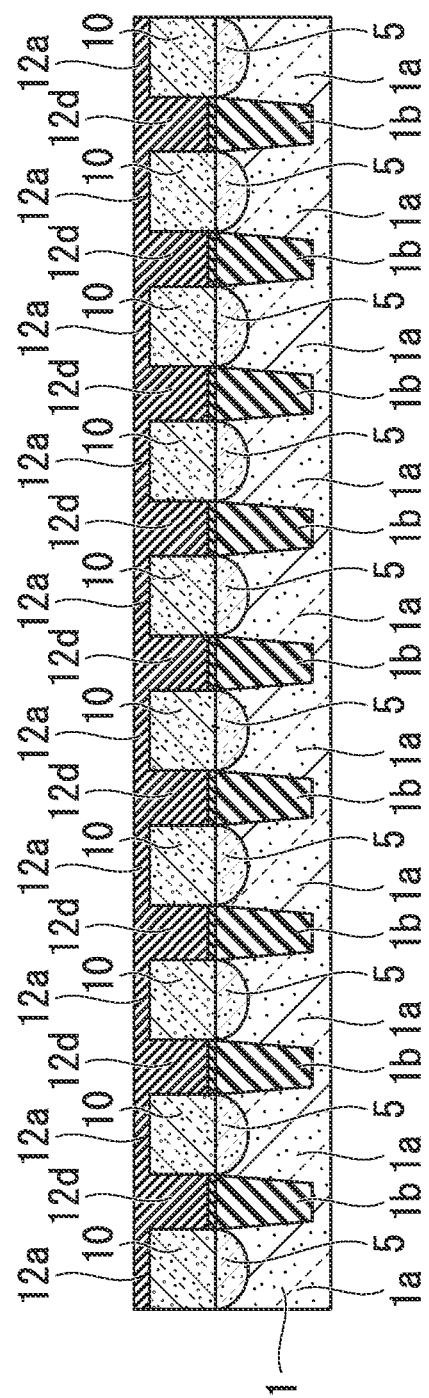
FIG. 8C is a fragmentary plan view, taken along a B-B' line of FIG. 8A, of the step, subsequent to the step of FIGS. 7A 7B and 7C, involved in the method of forming the semiconductor device of FIGS. 1A, 1B, and 1C, in accordance with one or more embodiments of the present invention.
Figure 9A:
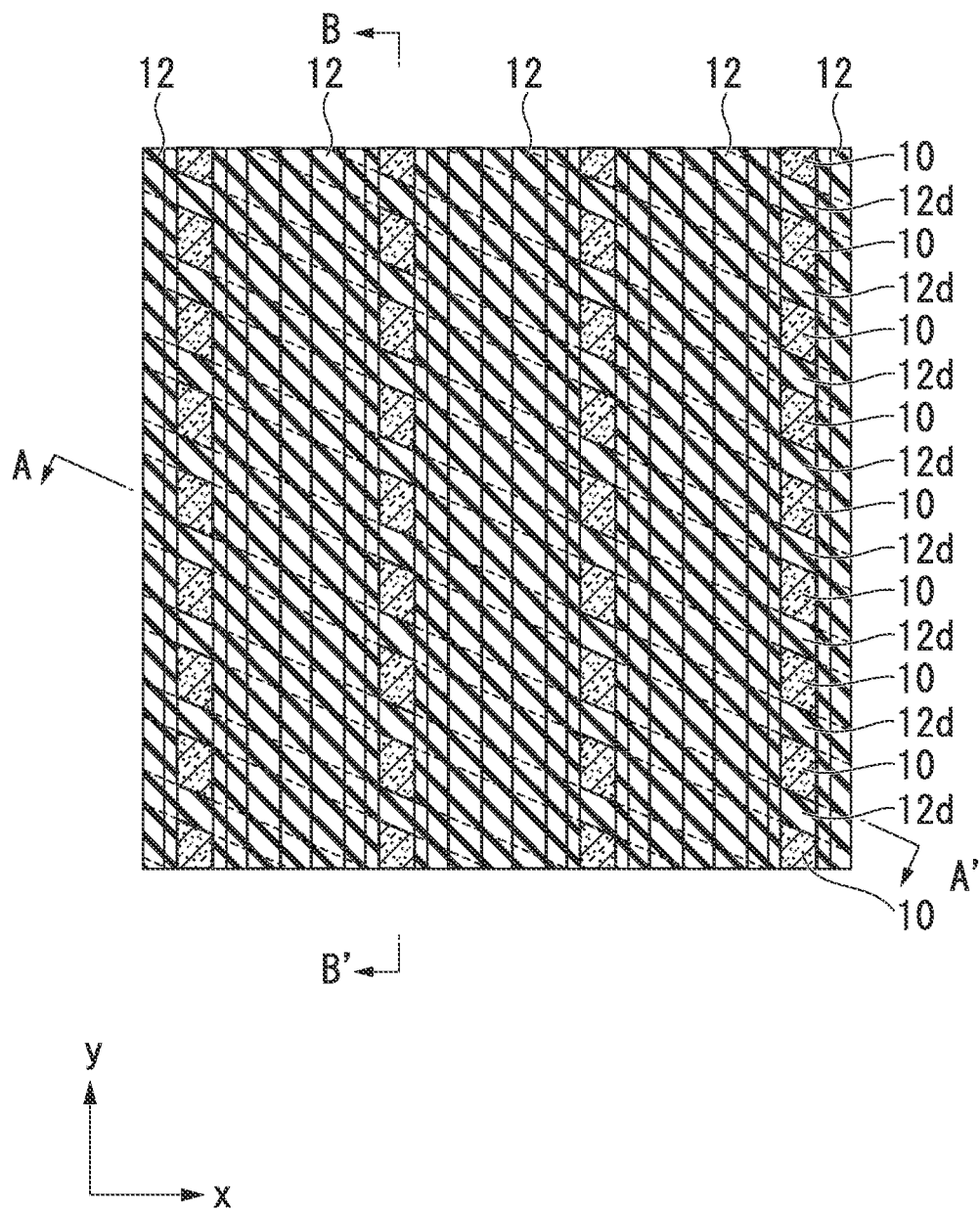
FIG. 9A is a fragmentary plan view of a step, subsequent to a step of FIGS. 8A 8B and 8C, involved in the method of forming the semiconductor device of FIGS. 1A, 1B, and 1C, in accordance with one or more embodiments of the present invention.
Figure 9B:
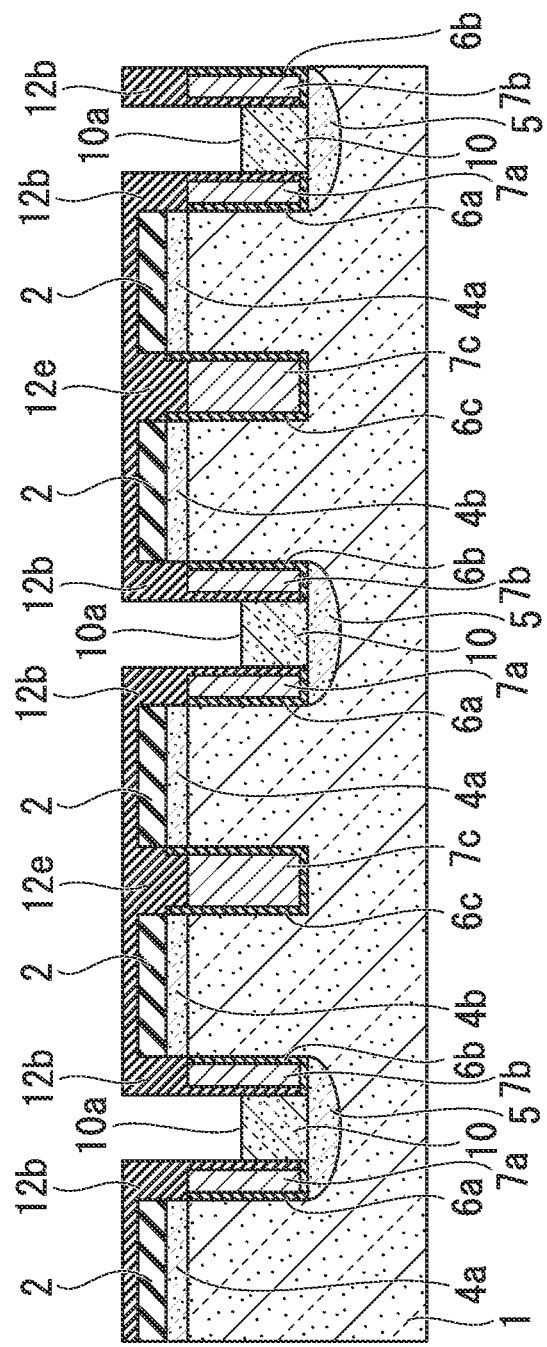
FIG. 9B is a fragmentary plan view, taken along an A-A' line of FIG. 9A, of the step, subsequent to the step of FIGS. 8A 8B and 8C, involved in the method of forming the semiconductor device of FIGS. 1A, 1B, and 1C, in accordance with one or more embodiments of the present invention.
Figure 9C:
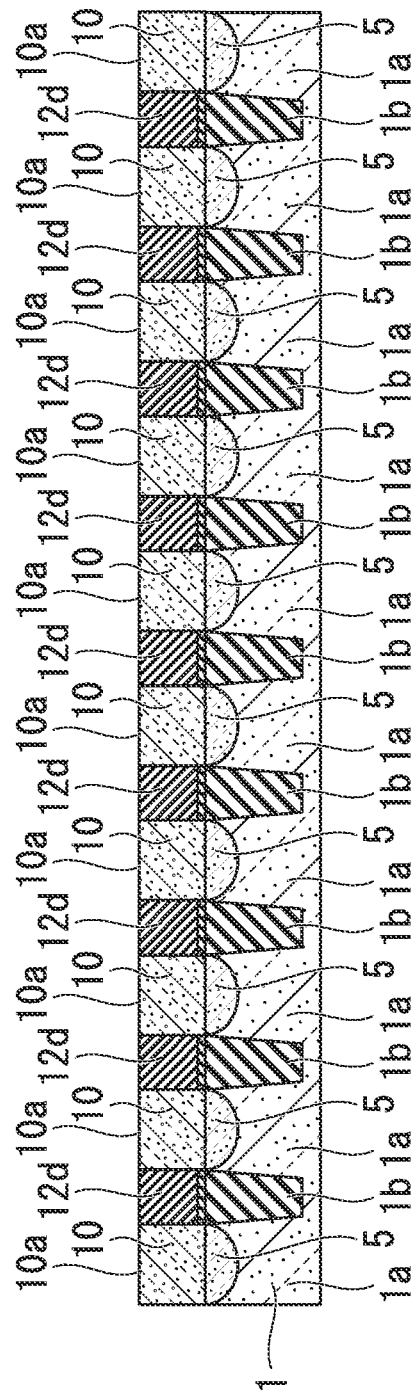
FIG. 9C is a fragmentary plan view, taken along a B-B' line of FIG. 9A, of the step, subsequent to the step of FIGS. 8A 8B and 8C, involved in the method of forming the semiconductor device of FIGS. 1A, 1B, and 1C, in accordance with one or more embodiments of the present invention.
Figure 10:
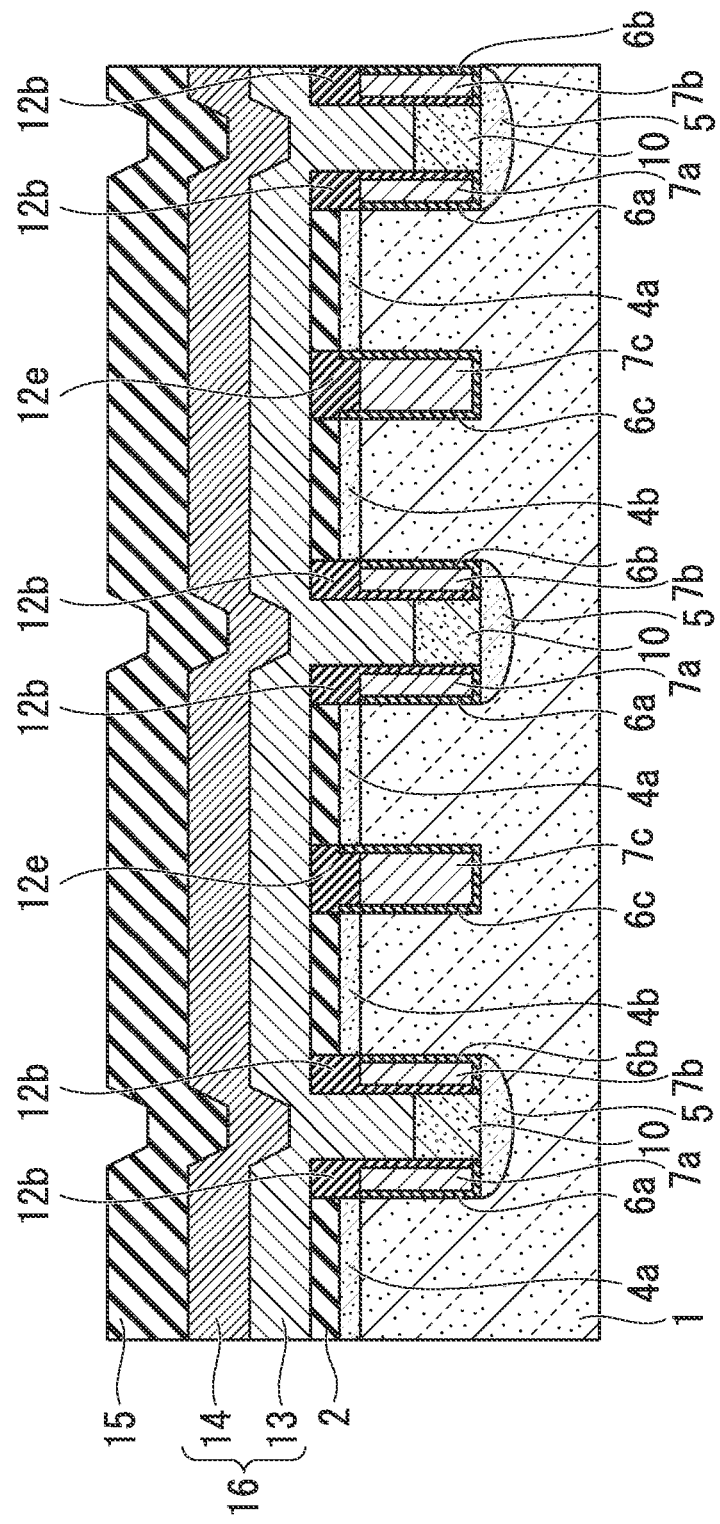
FIG. 10 is a fragmentary plan view, taken along an A-A' line of FIG. 9A, of a step, subsequent to the step of FIGS. 9A, 9B and 9C, involved in the method of forming the semiconductor device of FIGS. 1A, 1B, and 1C, in accordance with one or more embodiments of the present invention.
Figure 11C:
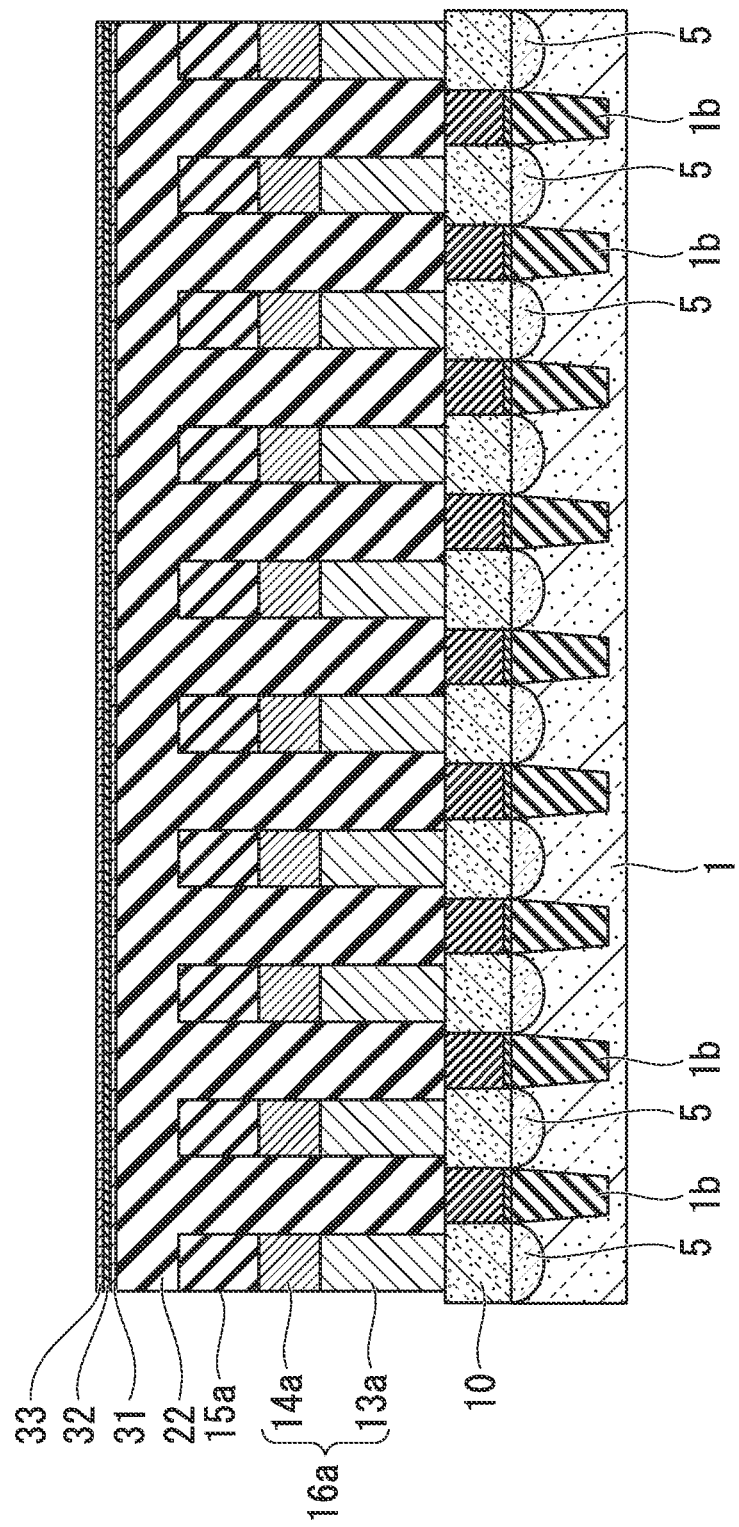
FIG. 11C is a fragmentary plan view, taken along a B-B' line of FIG. 11A, of the step, subsequent to the step of FIG. 10, involved in the method of forming the semiconductor device of FIGS. 1A, 1B, and 1C, in accordance with one or more embodiments of the present invention.

FIG. 2A, FIG. 4A, FIG. 6A, FIG. 7A, FIG. 8A, FIG. 9A, and FIG. 11A are internal views that show the plan-view layout in each of the manufacturing Processes, in which, to aid in understanding, a part of the internal structure is shown. FIG. 2B is a cross-sectional view along the cutting line A-A' in FIG. 2A, and FIG. 2C is a cross-sectional view along the cutting line B-B' shown in FIG. 2A. FIG. 3A is a cross-sectional view along the same line as the line A-A' in FIG. 2A, and FIG. 3B is a cross-sectional view along the same line as the line B-B' shown in FIG. 2A. FIG. 4B is a cross-sectional view along the cutting line A-A' in FIG. 4A, and FIG. 4C is a cross-sectional view along the cutting line B-B' shown in FIG. 4A. FIG. 5A is a cross-sectional view along the same line as the cutting line A-A' in FIG. 4A, an FIG. 5B is a cross-sectional view along the same line as the cutting line B-B' shown in FIG. 4A. FIG. 6B is a cross-sectional view along the cutting line A-A' in FIG. 6A, and FIG. 6C is a cross-sectional view along the cutting line B-B' shown in FIG. 6A. FIG. 7B is a cross-sectional view along the cutting line A-A' in FIG. 7A, and FIG. 7C is a cross-sectional view along the cutting B-B' shown in FIG. 7A. FIG. 8B is a cross-sectional view along the cutting line A-A' in FIG. 8A, and FIG. 8C is a cross-sectional view along the cutting line B-B' shown in FIG. 8A. FIG. 9B is a cross-sectional view along the cutting line A-A' in FIG. 9A, and FIG. 9C is a cross-sectional view along the cutting line B-B' shown in FIG. 9A. FIG. 10 is a cross-sectional view along the same line as the cutting line B-B' shown in FIG. 2A. FIG. 11B is a cross-sectional view along the cutting line A-A' in FIG. 11A, and FIG. 11C is a cross-sectional view along the cutting line B-B' shown in FIG. 11A.

In the description to follow, locations that are the same as in the above-noted semiconductor device 100 are assigned the same reference symbols and the descriptions thereof are omitted.

Referring to FIG. 2A to FIG. 2C, the Process for forming the active region, the process for forming the trench for word line formation and isolation layer formation, and the process for forming the gate insulating film will be described.

In FIG. 2A, the insulating film 6 (second insulating film) is omitted.

Active Region Forming Process:

First, the semiconductor substrate 1 is prepared, and an isolation trench for partitioning into the active regions (element formation regions) 1a is formed in the semiconductor substrate 1.

Specifically, for example, a silicon oxide film (SiO$_2$) (not shown) and a masking silicon nitride film (Si$_3$N$_4$) (not shown) are successively deposited onto the p-type single-crystal silicon substrate (semiconductor substrate) 1. Next, using photolithography and dry etching, the silicon nitride film, the silicon oxide film, and the p-type single-crystal silicon substrate 1 are successively patterned, so as to form on the p-type single-crystal silicon substrate 1 isolation trenches for the purpose of partitioning the active regions (element formation regions) 1a that extend in a prescribed direction. After that, the photoresist (not shown) used in the photolithography is removed. The regions formed between neighboring isolation trenches become the active regions 1a.

Next, by burying an insulating film into these isolation trenches, isolation regions 1b having an STI (shallow trench isolation) structure are formed.

Specifically, for example, a silicon nitride film formed by CVD or the like, a silicon oxide film formed by CVD or the like, or a coating material applied by SOD (spin on dielectric) is used as an insulating film that buries the isolation trenches to form the isolation regions 1b.

Next, the masking silicon nitride film and the silicon oxide film are removed.

Specifically, for example, the masking silicon nitride film and the silicon oxide film are removed using wet etching or the like.

By forming the isolation regions 1b in this manner, the active regions 1a are partitioned and formed between isolation regions 1b of the semiconductor substrate 1.

Although the present embodiment has a structure in which the isolation regions 1b or active regions 1a are shaped, extending as straight lines that intersect with the word lines and the bit lines that are perpendicular thereto, this structure is not a restriction.

Word Line Formation and Isolation Layer Formation Trench Forming Process:

After depositing an insulating film over the entire surface, photolithography is used to form on this insulating film patterning having an aperture pattern that has apertures for trenches 3 (3a, 3b) that are alternately spaced apart in the x direction (second direction), which is the direction that intersects with the active regions 1a, and that extend in the y direction (first direction). Next, using the insulating film (first insulating film) 2 that is patterned as shown in FIG. 2B as a mask (insulating film mask), anisotropic dry etching is used to form in the semiconductor substrate 1 the word line formation trenches (first trenches) 3a and the isolation conductive layer formation trenches (second trenches) 3b, which have a width that is smaller than, and extend in parallel to, the trenches 3a. In the present embodiment, the first direction width of the aperture pattern forming the first trenches 3a is, for example, 90 nm, and the first direction width of the aperture pattern forming the second trenches 3b is, for example, 35 nm.

Specifically, for example, a silicon oxide film is used as the insulating film 2, and an insulating film mask made of this silicon oxide film is used with anisotropic etching to form on the semiconductor substrate 1 the word line formation trenches (first trenches) 3a and the isolation conductive layer trenches (second trenches) 3b.

Opposing side walls 3aa and 3ab and the bottom surface 3A are formed in the first trenches 3a, and opposing side walls 3ba and 3bb and the bottom surface 3B are formed in the second trenches 3b.

By the formation of the first trenches 3a and the second trenches 3b, the active regions formed between the isolation regions 1b are spaced apart in a direction that is parallel to the word lines, and at each memory cell the semiconductor pillars 1aa are formed that are partitioned by the first trenches 3a, the second trenches 3b, and the isolation regions 1b.

Gate Insulating Film Forming Process:

Next, the insulating films (second insulating films) 6 that function as gate insulating films are formed on the inside walls within the word line formation trenches (first trenches) 3a and within the isolation conductive layer trenches (second trenches) 3b.

Specifically, for example, in the case in which the substrate is a silicon substrate, a silicon oxide film formed by thermal oxidation can be used as the insulating film (second insulating film) 6. The thickness of the insulating film 6 is, for example, 5 nm.

Buried Word Line Forming Process:

Referring to FIG. 3 to FIG. 6, the process of forming the buried word lines will be described. In FIG. 4A and FIG. 6A the insulating film (second insulating film) 6 is omitted.

First, as shown in FIG. 3A and FIG. 3B, a buried word line conductive film 7 is deposited over the entire surface.

Specifically, for example, a titanium nitride film having a thickness of 5 nm is deposited over the entire surface, using CVD. A tungsten film having a thickness of, for example, 15 nm is deposited thereover, and the laminated film of the titanium nitride film and the tungsten film (W/TiN film) is used as the conductive film 7. The thickness of the conductive film 7 is 20 nm. As described above, the width of the first trenches 3a is 90 nm, and the width of the second trenches 3b is 35 nm.

Therefore, when the conductive film 7 is formed, although the first trenches 3a are not buried by the conductive film 7, as shown in FIG. 3A, the second trenches 3b are buried by the conductive film 7. In order to achieve this constitution, it is necessary to form the width of the first trenches 3a so that it is larger than a dimension that is two times the thickness of the conductive film 7, that is, the gate electrode that will serve as the word line, and to form the width of the second trenches 3b smaller than the dimension. Also, it is preferable that the width of the second trenches 3b in the second direction be made ⅓ to ½ the width of the first trenches 3a in the second direction. If it is smaller than ⅓, the processing and formation of the second trenches 3b themselves becomes difficult, and if it is larger than ½, the space for forming other elements such as insulating films within the first trenches 3a becomes excessively small, making formation difficult. The gate electrode thickness as used here means the vertical thickness perpendicular to the underlayer plane (including the side walls and the bottom surface of the trench) on which the gate electrode is formed.

As shown in FIG. 4A to FIG. 4C, the buried word lines 7a, 7b are formed on both side walls (3aa, 3ab) of the first trench 3a in the form of side walls. Simultaneously with this, a conductive film (isolation conductive film) 7c that is buried inside the second trenches 3b is formed.

In addition to forming the word lines 7a, 7b on each of the side walls (3aa, 3ab) of the first trenches 3a that are parallel to the y direction and in mutual opposition, with the second insulating film 6 intervening therebetween, the conductive film (isolation conductive film) 7c is buried inside the second trenches 3b.

Specifically, for example, by etching back the entire surface using dry etching, side walls made of the conductive film 7 is formed on the side walls 3aa and 3ab of the first trenches 3a, with the second insulating film 6 intervening therebetween. A chlorine-containing gas plasma is used in this dry etching. In this dry etching, the silicon oxide films of the mask insulating film 2 and the gate insulating film 6 are not etched. By doing this, as shown in FIG. 4B, the first gate electrode 7a constituting the first vertical transistor is formed on the side wall 3aa of the first trenches 3a, with the gate insulating film 6 intervening therebetween, and the second gate electrode 7b constituting the second vertical transistor is formed on the side wall 3ab, with the gate insulating film 6 intervening therebetween. The upper surfaces of the gate electrodes 7a, 7b are formed so as to be lower than the surface of the semiconductor substrate 1, and also to be positioned at the same position as the bottom surface of the upper diffusion layer formed in a subsequent process. When this etching is done, the conductive film 7 disposed on the lower surface of the first trenches 3a is also removed.

Because the second trenches 3b are buried at the stage of depositing the conductive film 7, the above-noted etching back of the entire surface forms the buried conductive film 7c having an upper surface that is sunken down within the second trenches 3b, thereby maintaining the trench in the buried condition.

As shown in FIG. 5A and FIG. 5B, CVD or the like is used to form the insulating film (third insulating film) 8 made of a silicon nitride film over the entire surface, so as to cover the conductive film 7 of the inside of the first trenches 3a and the inside of the second trenches 3b.

As shown in FIG. 6A to FIG. 6C, a part formed on the bottom surface 3A inside the first trench 3a of the second insulating film 6 and a part formed on the part of the second insulating film 6 of the insulating film (third insulating film) 8 are removed using overall etching back, so as to expose the bottom surface 3A.

Specifically, for example, in this overall etching back, fluoromethanes such as $CH_3F$ or $CH_2F_2$ are used as plasma etching gas, thereby enabling highly selective etching of a silicon nitride film. As a result, a condition is obtained in which the first gate electrode 7a that is formed on the side wall 3aa and the second gate electrode 7b that is formed on the side wall 3ab of the first trench 3a are covered by a silicon nitride film 8a. Also, the upper surface of the buried insulating film 7c is coved by a silicon nitride film 8b in the second trench 3b.

By this overall etching back, the surface of the second insulating film 6 that is made of a silicon oxide film is exposed at the bottom surface 3A of the first trench 3a. In order to remove the second insulating film 6, the second overall etching back is done continuously after the above-noted overall etching back of the silicon nitride film. The second overall etching back uses a gas plasma containing $C_4F_8$, Ar, and $O_2$ to perform highly selective etching of the silicon oxide film. By doing this, the bottom surface 3A of the first trench 3a is exposed. By doing this, the second insulating film 6 is also separated into right and left, so as to be constituted independently as the first the gate insulating film 6a and the second gate insulating film 6b.

Following this, an impurity diffusion region is formed on the top part of the silicon pillar 1aa and in the under region from the bottom surface 3A of the first trench 3a.

Specifically, overall surface ion implantation of an n-type impurity such as phosphorus is done from the vertical direction into the surface of the semiconductor substrate 1. By doing this, an impurity is implanted into the regions of the semiconductor substrate 1 that are the top surface of the semiconductor pillar 1aa and the bottom surface 3A of the first trench 3a, that is, the region sandwiched by the third insulating films 8a. After that, the impurity is diffused by thermal treatment, thereby forming the upper diffusion layers (upper impurity diffusion regions) 4a, 4b that will serve as source regions and the lower diffusion layer (lower impurity diffusion region) 5 that will serve as a drain region. Because the upper diffusion layers 4a, 4b are formed by impurity diffusion in only the vertical direction, the bottom surface thereof becomes a plane. Because the lower diffusion layer 5 diffusion in lateral direction accompanies the diffusion in vertical direction, the bottom surface thereof becomes curved. The positions of the bottom surfaces of the upper diffusion layers 4a, 4b are the same as that of the top surface of the gate electrode 7, and the positions of the both ends in the second direction of the lower diffusion layer 5 are controlled by thermal treatment so as to become the same as those of the side walls of the first trenches 3a.

In the case in which a DRAM is ultimately constituted as the semiconductor device, a capacitor is disposed on the upper diffusion layer side and a bit line is connected to the lower diffusion layer side. In this case, mutually conflicting requirements occur such that, in order to prevent a capacitor from leaking the stored electrical charge, the impurity concentration of the upper diffusion layer needs to be small, whereas in order to reduce the overall resistance of bit lines, the impurity concentration of the lower diffusion layer needs to be high. In order to satisfy this requirement the present embodiment can implement ion implantations in two stages. That is, in the first stage of implantation (first impurity ion implantation), the acceleration conditions are controlled to introduce a low implantation dose (first implantation dose) of an impurity so that the projected ranges for the impurity implantations at both the upper and lower diffusion layer sides are positioned within the semiconductor substrate 1. Subsequently, in the second stage of implantation (second impurity ion implantation), the acceleration conditions are controlled so as to introduce a high implantation dose of an impurity at the upper diffusion layer side so that the projected range is positioned within the mask insulating film (first insulating film) 2. At the first time of implantation, a low implantation dose of an impurity is introduced into both the upper and lower diffusion layer sides, however, at the second time of implantation, the introduction into the upper diffusion layer side is not done, but a high implantation dose of an impurity is introduced into only the lower diffusion layer side. As a result, the upper diffusion layer becomes a low-density impurity region so that it is possible to make the lower diffusion layer a high-density impurity region. Although, under the condition of masking the upper diffusion layer side using lithography, it is possible to make a difference in density by re-implantation into only the lower diffusion layer side, if the above-noted method is used, the lithography process does not required, thereby facilitating formation of the low-density upper diffusion layer and the high-density lower diffusion layer.

In the second trench 3b, however, because the inside of the trench is filled by the buried film conductive 7c, an impurity is not introduced into the bottom surface, resulting in no formation of the impurity diffusion layer.

By the above-noted process, a first vertical MOS transistor that is made of the first gate insulating film 6a, the first gate electrode 7a that will serve as the word line, the first upper diffusion layer 4a, and the lower diffusion layer 5 is formed on the side wall 3aa of the first trench 3a. Also, a second vertical MOS transistor that is made of the second gate insulating film 6b, the second gate electrode 7b that will serve as the word line, the second upper diffusion layer 4b, and the lower diffusion layer 5 is formed on the side wall 3ab of another one inside the same trench. The lower diffusion layer 5 is shared in common by the first vertical MOS transistor and the second vertical MOS transistor. Additionally, the second trench 3b is formed between neighboring first trenches 3a. The buried conductive film 7c constituted by the same material as the first gate electrode 7a and the second gate electrode 7b is buried into the second trench 3b. The buried conductive film 7c will become the isolation layer. According to the method for manufacturing the semiconductor device of the present embodiment, because a constitution is possible in which the impurity diffusion layer having a conductivity that is the reverse of the conductivity type of the substrate 1 is not formed below the isolation conductive layer 7c, shorting between neighboring vertical MOS transistors that sandwich isolation conductive layer 7c is effectively prevented.

Selective Epitaxial Layer Forming Process

Next, as shown in FIG. 7A to FIG. 7C, the selective epitaxial layer 10 is formed on the lower impurity diffusion region 5 inside the first trench 3a, using a selective epitaxial growth method. This Process raises the conventional lower impurity diffusion region 5 by forming the semiconductor selective growth layer 10 on the lower impurity diffusion region 5. By adopting this constitution, it is possible not only to achieve a good electrical connection between the lower impurity diffusion region 5 and the bit line contact, but also to reduce the size of the bit line contact and to reduce the resistance thereof. In the first trench 3a, the word line 7a and the selective epitaxial layer 10 are electrically insulated by the insulating film (third insulating film) 8a. In the FIG. 7A, the insulating film (second insulating film) 6 is omitted.

Specifically, for example, in the case in which a monocrystalline silicon substrate is used as a substrate, in a hydrogen atmosphere in a chamber in which the pressure is 15 Torr and also the temperature is 800° C., under conditions such that a dichlorosilane ($SiH_2Cl_2$) is supplied at 200 ml/min and a hydrogen chloride (HCl) is supplied at 100 ml/min, a silicon layer having a thickness of 40 nm is, for example, epitaxially grown over the lower impurity diffusion region 5 in which the silicon is exposed. That is, the silicon layer is epitaxially grown with priority with a monocrystalline silicon substrate as a seed layer.

As shown in FIG. 8A to FIG. 8C, the insulating film (fourth insulating film) 12 covers the entire surface. In FIG. 8B, the insulating film (fourth insulating film) 12 and the insulating film (third insulating film) 8 are integrally illustrated without distinguishing therebetween, as a matter of convenience.

Specifically, for example, CVD is used to cover the semiconductor selective growth layer 10, and the silicon nitride film (fourth insulating film) 12 is formed over the entire surface with a thickness that does not bury the inside of the first trench 3*a*. More specifically, the semiconductor selective growth layer 10 is covered so as to form the silicon nitride film 12 above the word line 7*a* and on the side wall of the first trench 3*a* with the insulating film (third insulating film) 8 intervening therebetween, and on the isolation conductive layer inside the second trench 3*b*. In order for the conductive film (bit line contact) that is described later not to enter into the space between the neighboring semiconductor selective growth layers 10, the silicon nitride film 12 is buried into the spacing between the neighboring semiconductor selective growth layers 10 inside the first trench 3*a* in the y direction (first direction). In this case, the insulating film (fourth insulating film) 12 is buried also inside the second trench 3*b*. As shown in FIG. 8B and FIG. 8C, the silicon nitride film 12 is made by the part 12*a* formed on the semiconductor selective growth layers 10; the part 12*b* formed above the word line 7*a* and on the side wall inside the first trench 3*a* with the insulating film (third insulating film) 8 intervening therebetween; the part 12*c* formed on the insulating film mask 2; the part 12*d* buried between the neighboring semiconductor selective growth layers 10; and the part 12*e* formed on the isolation conductive layer 7*c* inside the second trench 3*b*.

As shown in FIG. 9A to FIG. 9C, the insulating film (fourth insulating film) 12*a* that is formed on the semiconductor selective growth layer 10 inside the first trench 3*a* is removed so as to expose the surface 10*a* of the semiconductor selective growth layer 10.

Specifically, for example, photolithography is used to form on the silicon nitride film (fourth insulating film) 12 that is formed on the entire surface a patterned photoresist (not shown) that has a line-shaped aperture part in the y direction, including the above of the part 12*a* formed on the semiconductor selective growth layer 10, and etching back is done by anisotropic dry etching using this photoresist as a mask, to remove, of the formed silicon nitride film 12, the line-shaped part along the y direction including the part 12*a* formed on the semiconductor selective growth layer 10, thereby exposing the surface 10*a* of the semiconductor selective growth layer 10. When this is done, because the silicon nitride film 12*a* on the semiconductor selective growth layer 10 and also the silicon nitride film 12*d* between the neighboring semiconductor selective growth layers 10 are simultaneously etched, as shown in FIG. 9C, the part 12*c* that is buried between the semiconductor selective growth layers 10 becomes flush with the surface 10*a* of the semiconductor selective growth layer 10.

Bit Line Contact and Bit Line Forming Processes

As shown in FIG. 10, the bit line contact and the bit line are formed on the semiconductor selective growth layer 10.

First, an insulating film 15 that will become a mask is formed on the entire surface above a conductive film 16 (13, 14) for a bit line contact and bit line.

Specifically, for example, the impurity-doped polysilicon layer 13 is first formed with burying the inside of the first trench 3*a* over the entire surface, and also with a thickness that links to the adjacent first trench 3*a* formed on the insulating film mask 2. The impurity-doped polysilicon layer 13 can be caused to include an impurity at the film formation step using CVD. Also, after forming a non-doped silicon film, it is possible to include an impurity by ion implantation. Next, a tungsten nitride (WN) film and a tungsten (W) film are successively laminated onto the impurity-doped polysilicon layer 13, thereby forming the W/WN film 14. Additionally, the silicon nitride film (insulating film) 15 that will become a mask is formed on the W/WN film 14.

Next, using conventionally known lithography and dry etching, by patterning the laminated film made of the W/WN film 14 and the polysilicon layer 13 in a linear shape, the bit line 16*a* made of the W/WN film 14*a* and the polysilicon layer 13*a* can be formed, as shown in FIG. 1.

The polysilicon layer 13*a* is electrically connected to the semiconductor selective growth layer 10 so as to have the function of a bit line contact and also is electrically connected with the neighboring bit line contact extending in the X direction (first direction) so as to have the function of a bit line.

In the method for manufacturing the semiconductor device of the present invention, the semiconductor selective growth layer 10 is formed on the bottom surface 3A of the first trench 3*a*, and, to the extent that the bottom surface 3A is raised, it is not necessary to do deep dry etching for the purpose of separation of the bit line contact, thereby enabling easy separation of the bit line contact. Also, it is not necessary to provide photoresist for the purpose of forming the bit line contact.

Capacitor Forming Process:

Next, Process for forming the capacitor will be described using FIG. 11A to 11C. FIG. 11A shows a plan view in the surface cutting the bit line 16*a* horizontally. In FIG. 11A, the silicon nitride film 21 is omitted.

First, the insulating film 21 that covers the bit line structure (bit line 16*a* and the silicon nitride film mask 15*a*) is formed.

Specifically, for example, low-pressure CVD (LP-CVD) is used to form the silicon nitride film 21 on the entire surface. Next, by etching back the entire surface of the silicon nitride film 21, a silicon nitride film 21 that covers the side surfaces of the bit line 16*a* and the silicon nitride film mask 15*a* and the upper surface of the silicon nitride film mask 15*a* is formed.

Next, a first interlayer insulating film 22 is formed and a capacitor contact hole 23*a* is formed in the first interlayer insulating film 22.

Specifically, for example, CVD is used to form an $SiO_2$ film containing boron (B) and phosphorus (P) over the entire surface, that is, a BPSG (borophosphosilicate glass) film is formed. By performing reflowing, the first interlayer insulating film 22 is formed. Next, using a mask having a capacitor-side contact hole pattern (not shown) anisotropic dry etching is used to etch the first interlayer insulating film 22 and the insulating film 2 therebeneath, so as to form the capacitor contact hole 23*a*. In the part in which the capacitor contact hole 23*a* and the upper impurity diffusion region 4 overlap, the surface of the upper impurity diffusion region 4 is caused to be exposed from the capacitor contact hole 23*a*.

Next, the capacitor contact plug 23 that fills the capacitor contact hole 23a is formed, and then a capacitor contact pad 24 is formed on the capacitor contact plug 23.

Specifically, for example, LP-CVD is used to bury the capacitor contact hole 23a using impurity-doped polysilicon. Next, CMP is used to polish and remove the polysilicon, so as to make the uppermost surface of the silicon nitride film 21, the upper surface of the first interlayer insulating film 22, and the upper surface of the impurity-doped polysilicon filling the capacitor contact hole 23a flush by filling the capacitor contact hole 23a to form the capacitor contact plug 23.

Next, tungsten nitride (WN) and tungsten (W) are successively laminated onto the capacitor contact plug 23, thereby forming a laminated film. Next, the laminated film is patterned so as to form the capacitor contact pad 24.

Next, a lower electrode 31 connected to the capacitor contact pad 24 is formed, and then a capacitor insulating film 32 and an upper electrode 33 are formed, thereby forming the capacitor 30.

Specifically, for example, a silicon nitride film is used to cover the capacitor contact pad 24 on the silicon nitride film 21 and the first interlayer insulating film 22, so as to form a stopper layer 25. Next, an un-shown silicon oxide film (SiO$_2$ film) is formed on the stopper layer 25. Photolithography is used to form photoresist (not shown) that is patterned on the silicon oxide film (SiO$_2$ film), and then dry etching using this photoresist as a mask is performed to etch the silicon oxide film (not shown) opposing the capacitor contact pad 24 and the stopper layer 25, thereby forming a cylindrical hole (not shown) exposing the capacitor contact pad 24. After that, the photoresist (not shown) is removed. Next, by forming a conductive film (for example, a titanium nitride film) on the inner surface of a cylindrical hole (not shown) and the upper surface of the capacitor contact pad 24, the lower electrode 31 that is made of this conductive film and that is crown-shaped is formed. Next, wet etching is used to remove the silicon oxide film (not shown). Next, the upper surface of the stopper layer 25 is exposed. Next, the capacitor insulating film 32 is formed so as to cover both the upper surface of the stopper layer 25 and the lower electrode 31. Next, the upper electrode 33 is formed so as to cover the surface of the capacitor insulating film 32. By doing this, a capacitor 30 made of the lower electrode 31, the capacitor insulating film 32, and the upper electrode 33 is formed on each of the capacitor contact pads 24.

After that, by forming an un-shown interlayer insulating film, via, interconnect and the like on the upper surface 33a of the upper electrode 33, the semiconductor device 100 of the present embodiment is manufactured.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a semiconductor substrate including a plurality of grooves each extending in a first direction and arranged in parallel with each other, each of the grooves including a bottom surface and first and second side surfaces and having a first width in a second direction substantially perpendicular to the first direction;
a plurality of element isolation regions on the semiconductor substrate and extending across the plurality of grooves in a third direction oblique to both the first and second directions and arranged in parallel with each other;
a plurality of first gate electrodes each on a corresponding one of the first side surfaces of the grooves and extending in the first direction;
a plurality of second gate electrodes each on a corresponding one of the second side surfaces of the grooves and extending in the first direction, in each of the grooves the respective one of the first gate electrodes and the respective one of the second gate electrodes are separated from each other by an insulating film;
a plurality of element isolation layers each on the semiconductor substrate between a respective pair of the grooves that are adjacent to each other, each of the element isolation layers extending in the first direction and having a second width in the second direction smaller than the first width;
a plurality of first diffusion regions each on the bottom surface of a respective one of the grooves;
a plurality of second diffusion regions on a top surface of the semiconductor substrate;
a plurality of bit lines over the semiconductor substrate and extending across the plurality of element isolation regions in the second direction, the plurality of bit lines being arranged in parallel with each other so that the bit lines intersect the first and second gate electrodes; and
a plurality of conductive layers each on the bottom surface of a respective one of the grooves and separated from the first and second gate electrodes by the insulating film in the respective one of the grooves so as to connect the respective bit lines with the bottom surface of the respective grooves.

* * * * *